United States Patent
Bell, Jr. et al.

(10) Patent No.: US 7,904,870 B2
(45) Date of Patent: *Mar. 8, 2011

(54) METHOD AND APPARATUS FOR INTEGRATED CIRCUIT DESIGN MODEL PERFORMANCE EVALUATION USING BASIC BLOCK VECTOR CLUSTERING AND FLY-BY VECTOR CLUSTERING

(75) Inventors: Robert H. Bell, Jr., Austin, TX (US); Wen-Tzer Thomas Chen, Austin, TX (US); Venkat Rajeev Indukuru, Austin, TX (US); Pattabi Michael Seshadri, Austin, TX (US); Madhavi Gopal Valluri, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 385 days.

This patent is subject to a terminal disclaimer.

(21) Appl. No.: 12/112,035

(22) Filed: Apr. 30, 2008

(65) Prior Publication Data

US 2009/0276191 A1 Nov. 5, 2009

(51) Int. Cl.
G06F 9/455 (2006.01)

(52) U.S. Cl. ........... 716/132; 716/100; 716/101; 703/13; 703/14

(58) Field of Classification Search ............... 716/1–3, 716/18; 703/13–14; 712/3–9, 200, 205–206
See application file for complete search history.

(56) References Cited

U.S. PATENT DOCUMENTS

| | | | |
|---|---|---|---|
| 4,266,270 A | 5/1981 | Daniels | |
| 5,263,153 A | 11/1993 | Intrater | |
| 5,723,962 A * | 3/1998 | Mizukami et al. | 318/571 |
| 5,752,013 A | 5/1998 | Christensen | |
| 5,938,760 A | 8/1999 | Levine | |
| 5,961,654 A | 10/1999 | Levine | |
| 6,047,367 A | 4/2000 | Heller | |
| 6,085,338 A | 7/2000 | Levine | |

(Continued)

FOREIGN PATENT DOCUMENTS

JP 04184678 7/1992

OTHER PUBLICATIONS

Wikipedia—"K-Means Algorithm"—Online Wikipedia Reference Material (Dec. 2007).

(Continued)

*Primary Examiner* — Nghia M Doan
(74) *Attorney, Agent, or Firm* — Matt Talpis; Mark P Kahler

(57) ABSTRACT

A test system or simulator includes an enhanced IC test application sampling software program that executes test application software on a semiconductor die IC design model. The enhanced test application sampling software may include trace, simulation point, CPI error, clustering, instruction budgeting, and other programs. The enhanced test application sampling software generates basic block vectors (BBVs) and fly-by vectors (FBVs) from instruction trace analysis of test application software workloads. The enhanced test application sampling software utilizes the microarchitecture dependent information to generate the FBVs to select representative instruction intervals from the test application software. The enhanced test application sampling software generates a reduced representative test application software program from the BBV and FBV data utilizing a global instruction budgeting analysis method. Designers use the test system with enhanced test application sampling software to evaluate IC design models by using the representative test application software program.

18 Claims, 9 Drawing Sheets

U.S. PATENT DOCUMENTS

| | | | |
|---|---|---|---|
| 6,295,623 B1 * | 9/2001 | Lesmeister et al. | 714/741 |
| 6,351,844 B1 | 2/2002 | Bala | |
| 6,466,898 B1 | 10/2002 | Chan | |
| 6,912,673 B1 | 6/2005 | Wyland | |
| 7,020,678 B1 * | 3/2006 | Hubbard | 709/201 |
| 7,694,303 B2 * | 4/2010 | Hahn et al. | 718/104 |
| 7,802,236 B2 * | 9/2010 | Calder et al. | 717/130 |
| 2002/0116166 A1 | 8/2002 | El-Ghoroury | |
| 2004/0068701 A1 * | 4/2004 | Chang et al. | 716/4 |
| 2004/0111708 A1 | 6/2004 | Calder | |
| 2004/0216013 A1 | 10/2004 | Sun | |
| 2007/0157177 A1 | 7/2007 | Bouguet | |
| 2009/0182994 A1 * | 7/2009 | Bell et al. | 712/227 |
| 2009/0183127 A1 | 7/2009 | Bell, Jr. | |
| 2009/0199138 A1 * | 8/2009 | Bell et al. | 716/4 |
| 2009/0276190 A1 * | 11/2009 | Bell et al. | 703/1 |

OTHER PUBLICATIONS

Robinson—"Initial Starting Point Analysis for K-Means clustering: A Case Study"—Proceedings of ALAR 2006 Conference on Applied Research in Information Technology (Mar. 2006.)

Hamerly-1—"SimPoint 3.0: Faster and More Flexible Program Analysis"—Dept Computer Science and Engineering UC San Diego (Sep. 2005).

Hamerly-2—"How to Use SimPoint to Pick Simulation Points"—Dept Computer Science and Engineering UC San Diego (Mar. 2004).

Anderson—"Continuous Profiling: Where Have All the Cycles Gone?"—Digital Equipment Corporation (Oct. 13, 1999).

Eyerman—"A Performance Counter Architecture for Computing Accurate CPI Components"—Proceedings of the 12th International Conference on Architectural Support for Programming Languages and Operating Systems (2006).

AZIMI—"Online Performance Analysis by Statistical Sampling of Microprocessor Performance Counters"—Proceedings of the 19th Annual International Conference on Supercomputing (2005).

Luo—"Automatically Selecting Representative Traces for Simulation Based on Cluster Analysis of Instruction Address Hashes"—The University of Texas at Austin IBM Server Group (2005).

Wunderlich-1—"An Evaluation of Stratified Sampling of Microarchitecture Simulations"—Computer Architecture Laboratory ISCA-31 (Jun. 2004).

Wunderlich-2—"Smarts: Accelerating Microarchitecture Simulation via Rigorous Statistical Sampling"—International Symposium on Computer Architecture ISCA-30 (Jun. 2003).

Wunderlich-3—"TurboSmarts: Accurate Microarchitecture Simulation Sampling in Minutes"—Computer Architecture Lab at Carnegie Mellon CALCM (2004).

Taufer—"Scalability and Resource Usage of an OLAP Benchmark on Cluster of PCs"—Proceedings of 14th Annual ACM Symposium on Parallel Algorithms and Architectures (2002).

Puzak—"An Analysis of the Effects of Miss Clustering on the Cost of a Cache Miss"—IBM SIGMICRO—(2007).

Annavaram—"The Fuzzy Correlation between Code and Performance Predictability"—Proceedings of the 37th International Symposium on Microarchitecture (2004).

Lau-1—"Transition Phase Classification and Prediction"—11th International Symposium on High Performance Computer Architecture, Feb. 2005.

Lau-2—"The Strong Correlation Between Code Signatures and Performance"—IEEE International Symposium on Performance Analysis of Systems and Software, Mar. 2005.

Laurenzano—"Low Cost Trace-driven Memory Simulation Using SimPoint"—Workshop on Binary Instrumentation and Applications (held in conjunction with PACT2005), St. Louis, MO Sep. 2005.

Pereira—"Dynamic Phase Analysis for Cycle-Close Trace Generation"—International Conference on Hardware/Software Codesign and System Synthesis, Sep. 2005.

Sherwood-1—"Basic Block Distribution Analysis to Find Periodic Behavior and Simulation Points in Applications" In Proceedings of the International Conference on Parallel Architectures and Compilation Techniques (PACT), Sep. 2001.

Sherwood-2—"Automatically Characterizing Large Scale Program Behavior"—Architectural Support for Programming Languages and Operating Systems ASPLOS at University of California, San Diego (2002).

Lyengar—"Representative Traces For Processor Models with Infinite Cache"—IBM Research Division presented at the International Symposium on High Performance Computer Architecture HPCA (2005).

Perelman—"Picking Statistically Valid and Early Simulation Points"—Proceedings of the International Conference on Parallel Architectures and Compilation Techniques PACT (Sep. 2003).

SimPoint—"SimPoint Overview"—downloaded from http://www.cse.ucsd.edu/~calder/simpoint/phase_analysis.htm on Oct. 20, 2007.

Bhargava—"Improving Dynamic Cluster Assignment for Clustered Trace Cache Processor"—The University of Texas at Austin and 2003 Annual International Symposium on Computer Architecture (Jun. 2003).

Chen—"Nonlinear Adaptive Distance Metric Learning for Clustering"—Department of Computer Science and Engineering Arizona State University (Aug. 2007).

Taylor—"The use of Process Clustering in Distributed-System Event Displays"—Proceeding of the 1993 CAS Conference (1993).

Hong—"Cluster-Based Input/Output Trace Synthesis" 24th IEEE International Performance, Computing, and Communications Conference, 2005. IPCCC 2005.

* cited by examiner

SUBSET OR INSTRUCTION SEGMENT OF MUCH LARGER TEST APPLICATION SOFTWARE (WORKLOAD) OF COMPILED LINES OF CODE

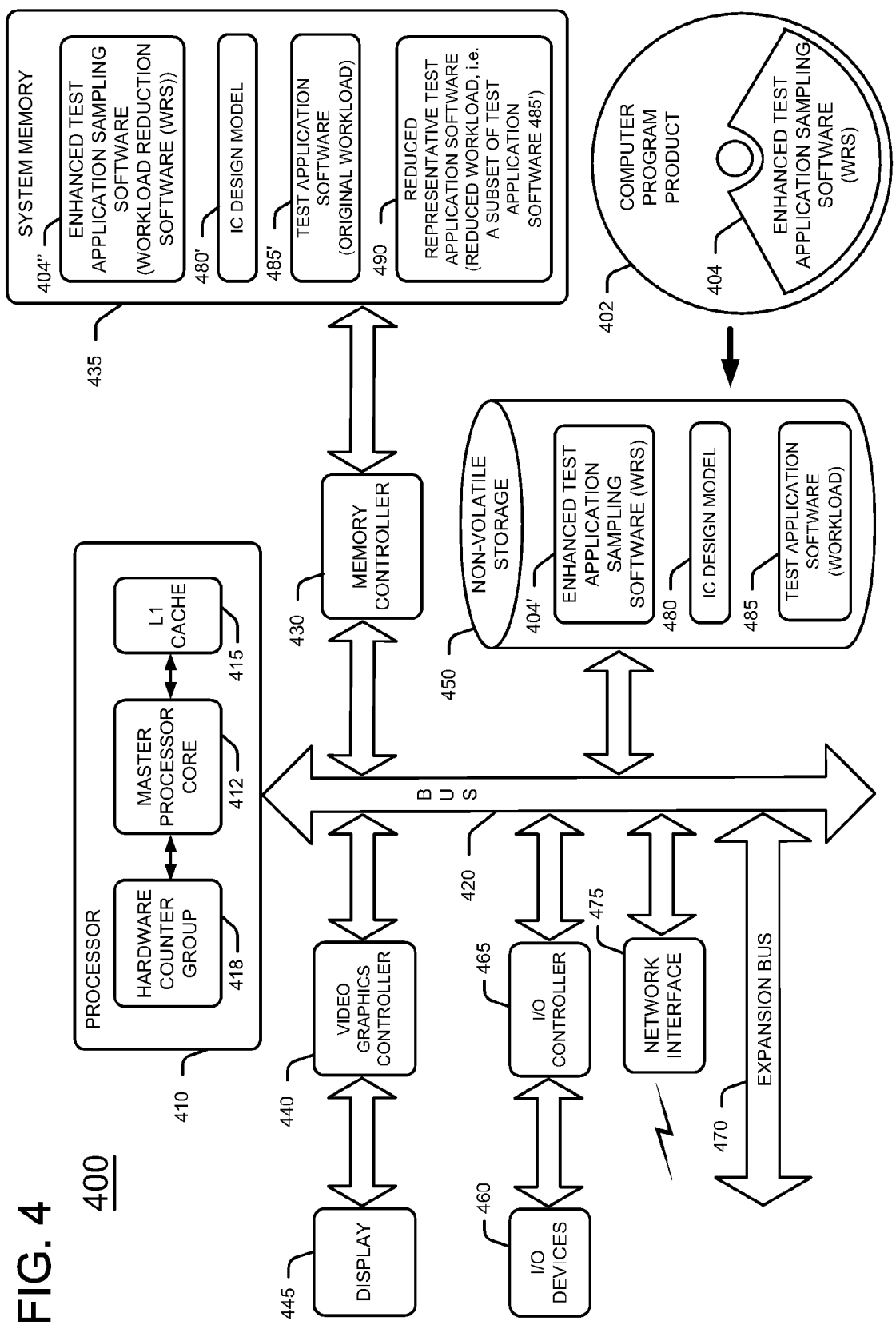

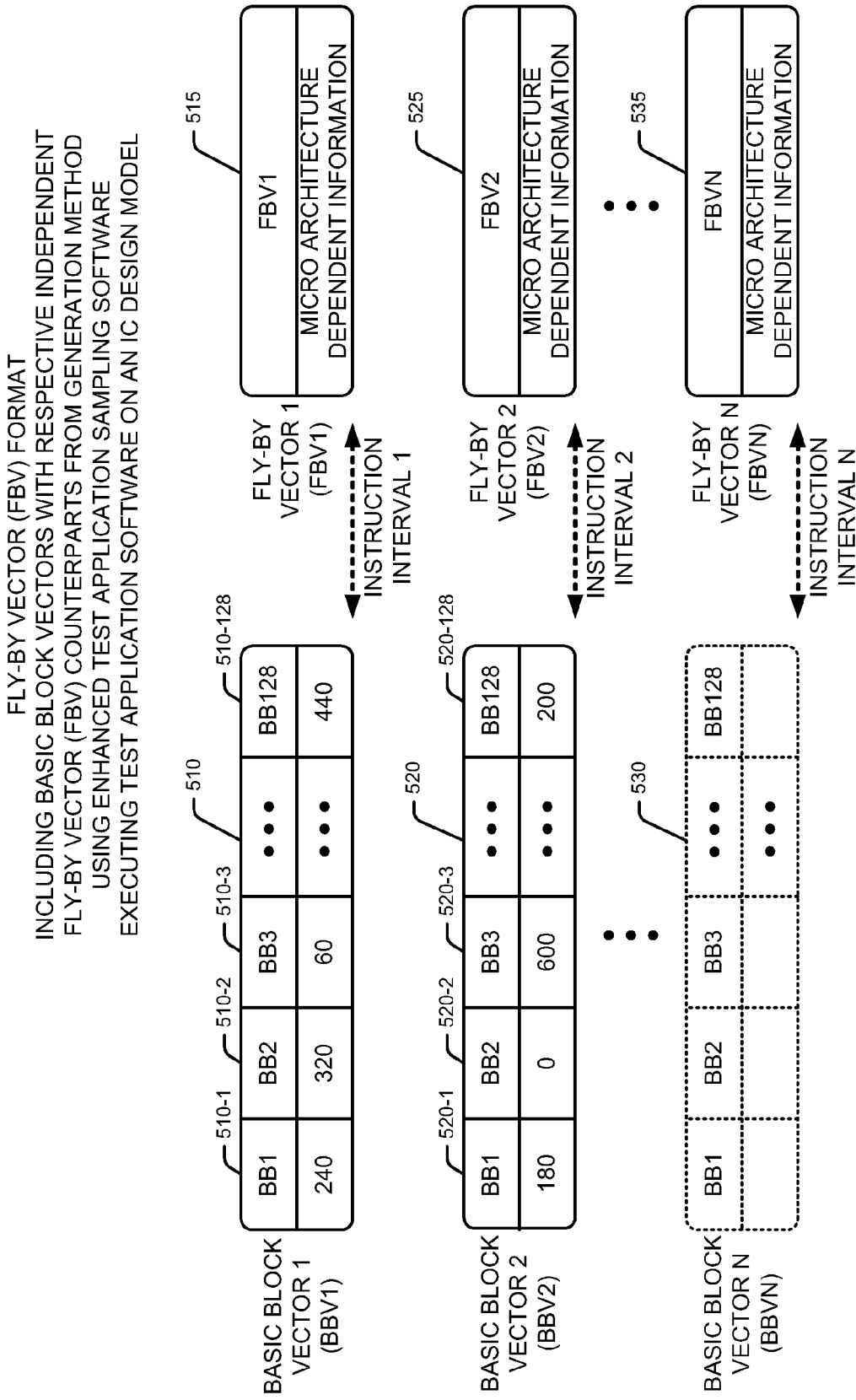

FLY-BY VECTOR (FBV) EXAMPLES FOR FBV1 INCLUDING
MICROARCHITECTURE DEPENDENT INFORMATION FROM INSTRUCTION
INTERVAL 1 BY GENERATION METHOD USING ENHANCED TEST
APPLICATION SAMPLING SOFTWARE EXECUTING TEST APPLICATION
SOFTWARE ON AN IC DESIGN MODEL

FLY-BY VECTOR 1 (FBV1) EXAMPLE 1 — 610

| FBV1-1 | |
|---|---|
| L1 CACHE MISSES | 20 |

{ MICROARCHITECTURE DEPENDENT INFORMATION }

FLY-BY VECTOR 1 (FBV1) EXAMPLE 2 — 620

| FBV1-2 | | |
|---|---|---|
| L1 CACHE MISSES | BRANCH MISPREDICTION COUNT | |
| 18 | 22 | |

{ MICROARCHITECTURE DEPENDENT INFORMATION }

FLY-BY VECTOR 1 (FBV1) EXAMPLE 3 — 630

| FBV1-3 | | |
|---|---|---|
| L1 CACHE MISSES | BRANCH MISPREDICTION COUNT | DERAT MISSES |
| 24 | 10 | 4 |

{ MICROARCHITECTURE DEPENDENT INFORMATION }

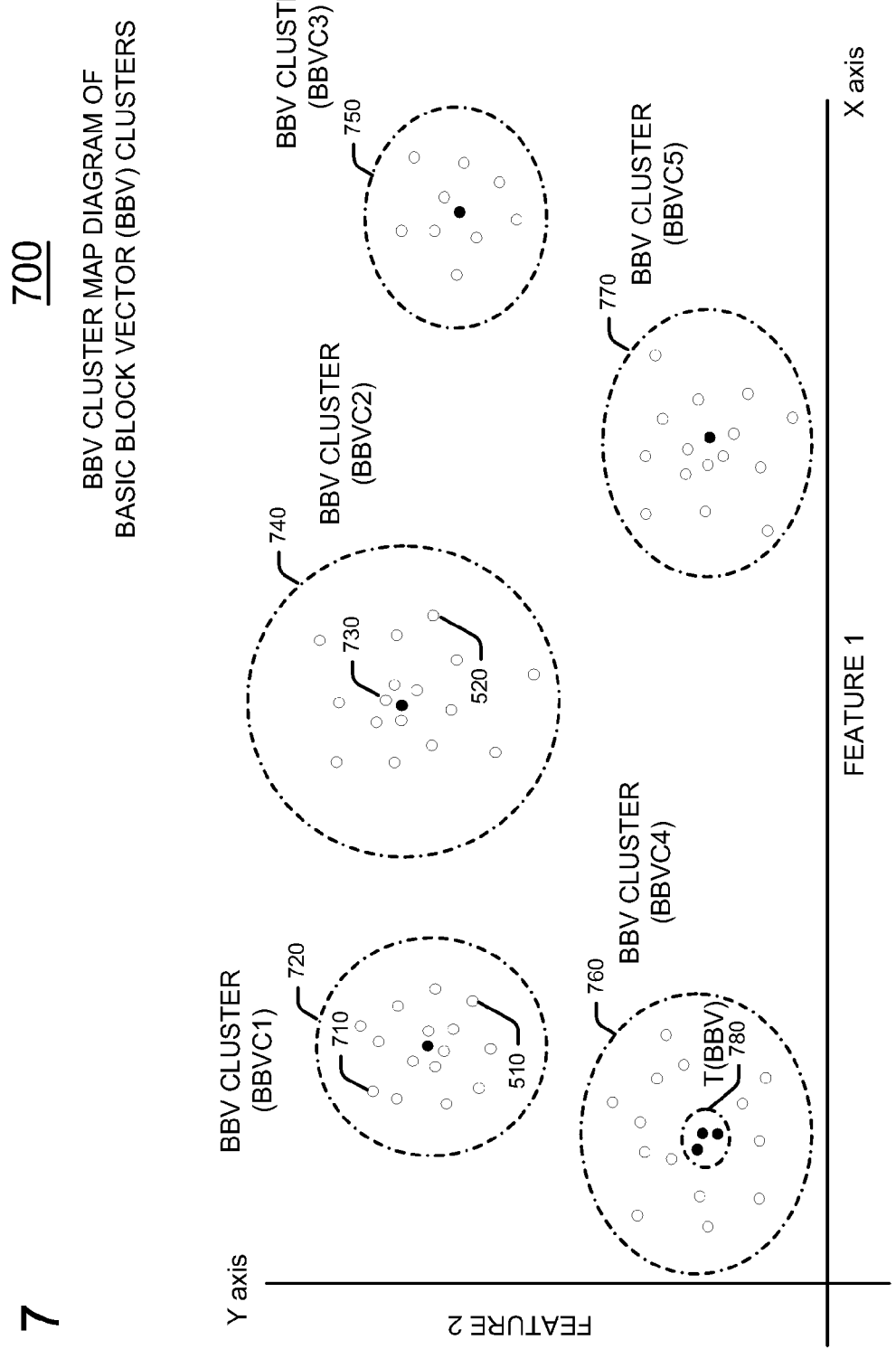

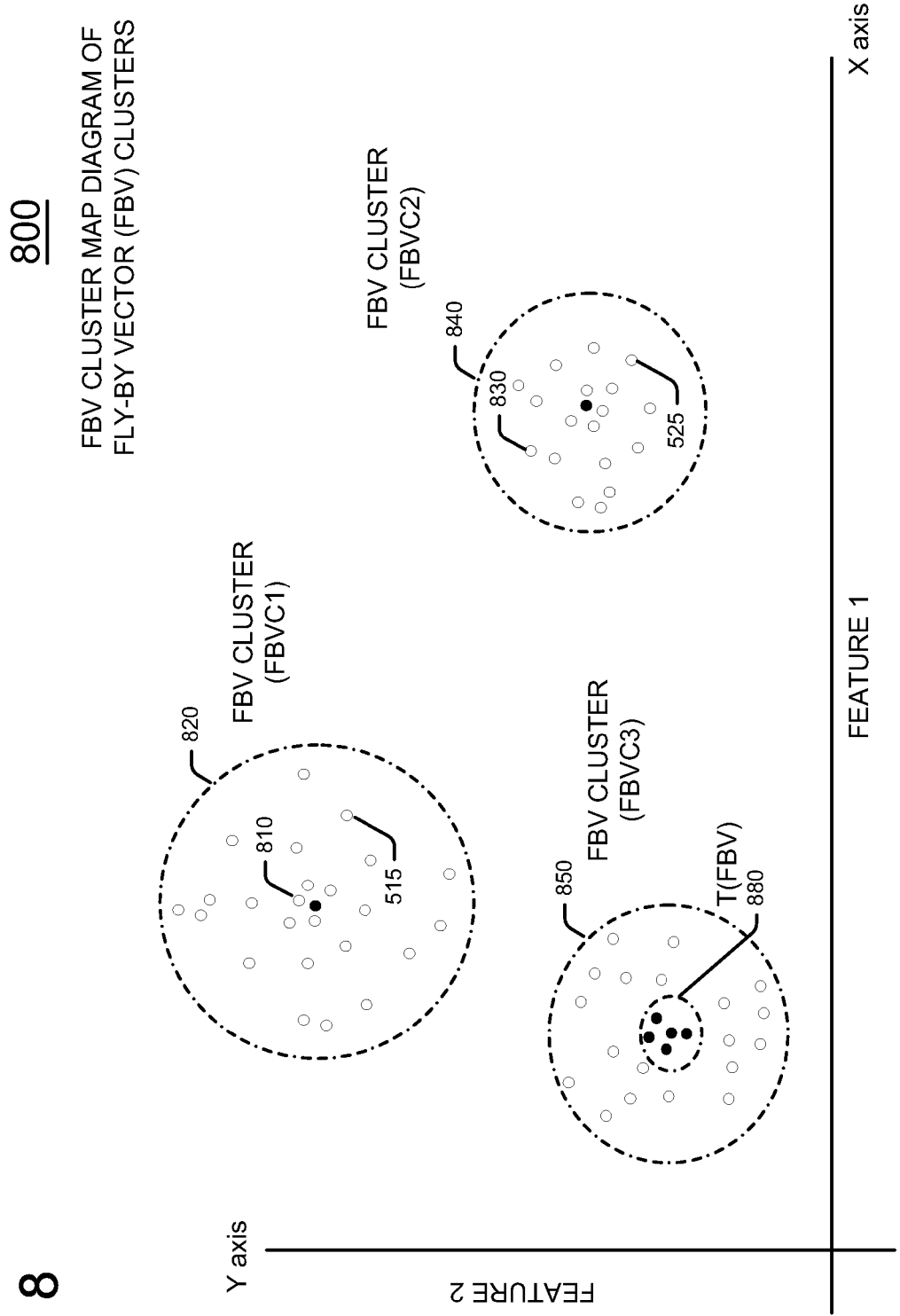

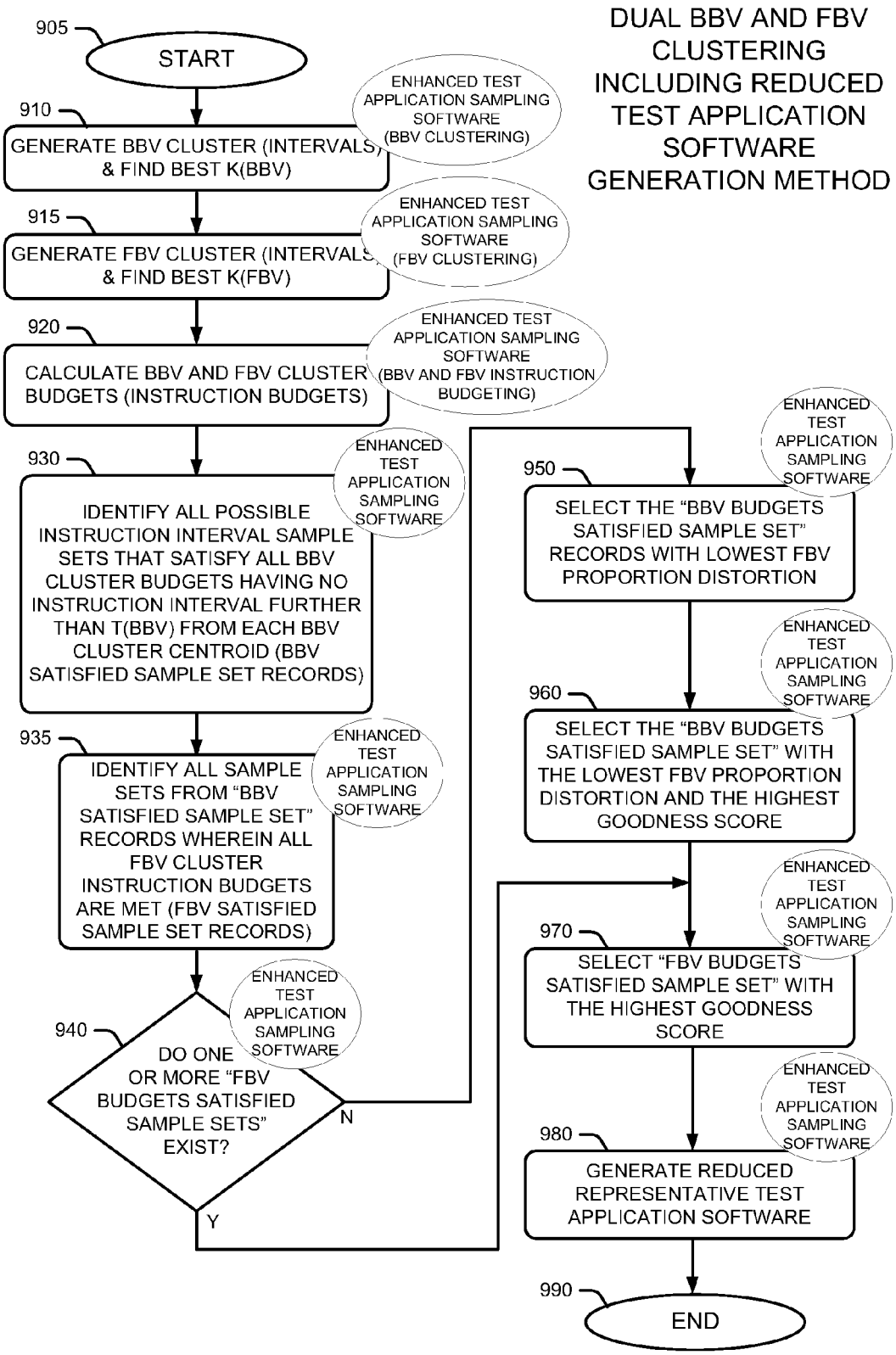

METHOD AND APPARATUS FOR INTEGRATED CIRCUIT DESIGN MODEL PERFORMANCE EVALUATION USING BASIC BLOCK VECTOR CLUSTERING AND FLY-BY VECTOR CLUSTERING

TECHNICAL FIELD OF THE INVENTION

The disclosures herein relate generally to information handling systems (IHSs) that operate as electronic design test systems, and more particularly, to a methodology and apparatus for evaluating performance characteristics of processors and other devices within integrated circuits (ICs) during IC design.

BACKGROUND

An information handling system (IHS) may include a processor or other devices for processing, managing, communicating or otherwise manipulating information. Modern IHSs often include integrated circuits (ICs) that incorporate several components integrated together on a common semiconductor die. Some IHSs operate as test systems that test or otherwise evaluate the functionality and performance characteristics of IC designs during the development process of the IC. Modern IC development processes employ early design guidelines such as design specifications that design professionals may use prior to and during the development process. Design specifications may include stringent requirements relating to the overall speed capability and throughput of the IC or other performance requirements. For example, a design requirement of a particular IC may demand that the IC functions without failure at a predetermined clock frequency. In another example, an IC design requirement may specify that a particular IC must execute standard test application sampling software to precise performance specifications.

With such stringent requirements on IC design performance, designers strive to develop extensive test strategies early in the IC development process. It is very common to apply these test strategies before the physical IC design hardware is complete. Designers develop computer simulation or IC design models and test various parameters of the IC in a virtual test mode. The more detailed or accurate the IC design model that the test simulation employs, the more accurate the corresponding testing results become. However, more detailed IC models result in longer test application software execution times during testing.

Designers use test application software programs, such as workload programs to extensively test IC designs during the development process. Test application software such as workload programs may include large numbers of program instructions that often number in the hundreds of billions or trillions. Due to the large number of instructions in these applications, it may not be feasible to run or execute a test application software program on an IC design model and still evaluate results in a timely manner. For example, in a cycle-accurate processor model that executes about 10,000 instructions per second, a one trillion instruction test application software program may take over 3 years to complete. A cycle-accurate processor model is an IC design model that accurately reflects the per clock cycle simulation of instruction software within the IC design under evaluation. Hours of a typical test application software program execution in a real world processor may correspond to months or years of execution time of an IC design model within a simulator.

What is needed is a testing method and apparatus that addresses the problems faced by integrated circuit (IC) designers described above.

SUMMARY

Accordingly, in one embodiment, a method of integrated circuit (IC) design model testing is disclosed. The method includes providing an original workload program to a simulator test system. The original workload program exhibits a first executable instruction length. The simulator test system includes IC design model and workload reduction software (WRS). The method also includes apportioning, by the WRS of the simulator test system, the original workload program into a plurality of instruction intervals. The method further includes generating, by the WRS of the simulator test system, a respective basic block vector (BBV) per instruction interval, the resultant BBVs including basic block execution count information. The method still further includes generating, by the WRS of the simulator test system, a respective fly-by vector (FBV) per instruction interval independent of the BBV for that same instruction interval, the resultant FBVs including microarchitecture dependent information. The method also includes clustering, by the WRS of the simulator test system, the resultant BBVs into a plurality of BBV clusters, each BBV cluster representing a program phase of the original workload program. The method further includes clustering, by the WRS of the simulator test system, the resultant FBVs into a plurality of FBV clusters, each FBV cluster representing a program phase of the original workload program, the clustering of FBVs being independent of the clustering of the BBVs. The method still further includes generating, by the WRS of the simulator test system, a reduced workload program representative of the original workload program, by using information related to the BBV clusters and FBV clusters, the reduced workload program exhibiting a second executable instruction length less than the first executable instruction length.

In another embodiment, an integrated circuit (IC) design model simulator test system is disclosed. The system includes a processor and a memory store coupled to the processor. The memory store includes an IC design model and an original workload program exhibits a first executable instruction length. The memory store is configured to apportion the original workload program into a plurality of instruction intervals. The memory store is also configured to generate a respective basic block vector (BBV) per instruction interval, the resultant BBVs including basic block execution count information. The memory store is further configured to generate a respective fly-by vector (FBV) per instruction interval independent of the BBV for that same instruction interval, the resultant FBVs including microarchitecture dependent information. The memory store is still further configured to cluster the resultant BBVs into a plurality of BBV clusters, each BBV cluster representing a program phase of the original workload program. The memory store is also configured to cluster the resultant FBVs into a plurality of FBV clusters, each FBV cluster representing a program phase of the original workload program, the clustering of FBVs being independent of the clustering of the BBVs. The memory store is also configured to generate a reduced workload program representative of the original workload program, by using information related to the BBV clusters and FBV clusters, the reduced workload program exhibiting a second executable instruction length less than the first executable instruction length.

BRIEF DESCRIPTION OF THE DRAWINGS

The appended drawings illustrate only exemplary embodiments of the invention and therefore do not limit its scope because the inventive concepts lend themselves to other equally effective embodiments.

FIG. 4 is a block diagram of an information handling system that executes enhanced test application sampling software and test application software on an IC design model.

FIG. 5 is a representation of a basic block vector (BBV) format with corresponding independent fly-by vector format that the disclosed methodology generates.

FIG. 6 is a representation of fly-by vector (FBV) examples of microarchitecture dependent information that the disclosed methodology generates.

FIG. 7 is a BBV cluster map diagram depicting cluster data points and clusters from the mapping of basic block vectors.

FIG. 8 is an FBV cluster map diagram depicting cluster data points and clusters from the mapping of fly-by vectors.

FIG. 9 is a flow chart that depicts the execution of enhanced test application sampling software and test application software on an IC design model with dual BBV and FBV clustering using global budgeting analysis in accordance with one embodiment of the disclosed methodology.

DETAILED DESCRIPTION

Complex IC designs, such as a PowerPC processor IC, may include millions, billions, or more transistors. (PowerPC is a trademark of the IBM Corporation.) A particular integrated circuit (IC) may include a grouping and interconnection of transistors on the semiconductor die that may form a component such as an AND gate, OR gate, flip flop, multiplexer, or other such component. IC designers generate detailed IC transistor, component, and interconnect schematics as part of IC design and development work. IC designers develop software simulation models of a particular IC from these transistor, component, and interconnect schematics. Software simulation models are computer models or IC design models that depict the physical representation of a particular IC design in a virtual mode. By grouping transistors into components and interconnecting the components forming the detailed IC transistor and component schematics, designers develop accurate IC design models for use in test simulation systems.

IC designers may employ multiple test programs during the development and performance evaluation of IC designs. Simulation tools, such as "Simulation Program with Integrated Circuit Emphasis" (SPICE) software, originally a UC Berkeley development tool, are common early development tools that IC designers use. SPICE may be particularly useful in the area of IC benchmark analysis. IC designers may use SPICE software to simulate analog and digital timing characteristics of the IC design under development.

IC designers may use SPICE or other IC modeling and simulation software to analyze an IC design to compare that design against IC design and performance requirements. It may be advantageous to provide benchmark analysis such as design and performance evaluation prior to hardware production of the IC. Advantages of this approach may include shortening the costly process of building the IC, testing the IC, and redesigning the IC until achieving acceptable results. In one example, IC integrators use the output of a SPICE software model or other collection of IC timing analysis as input into an IC benchmark and performance evaluation process.

Figure 1:
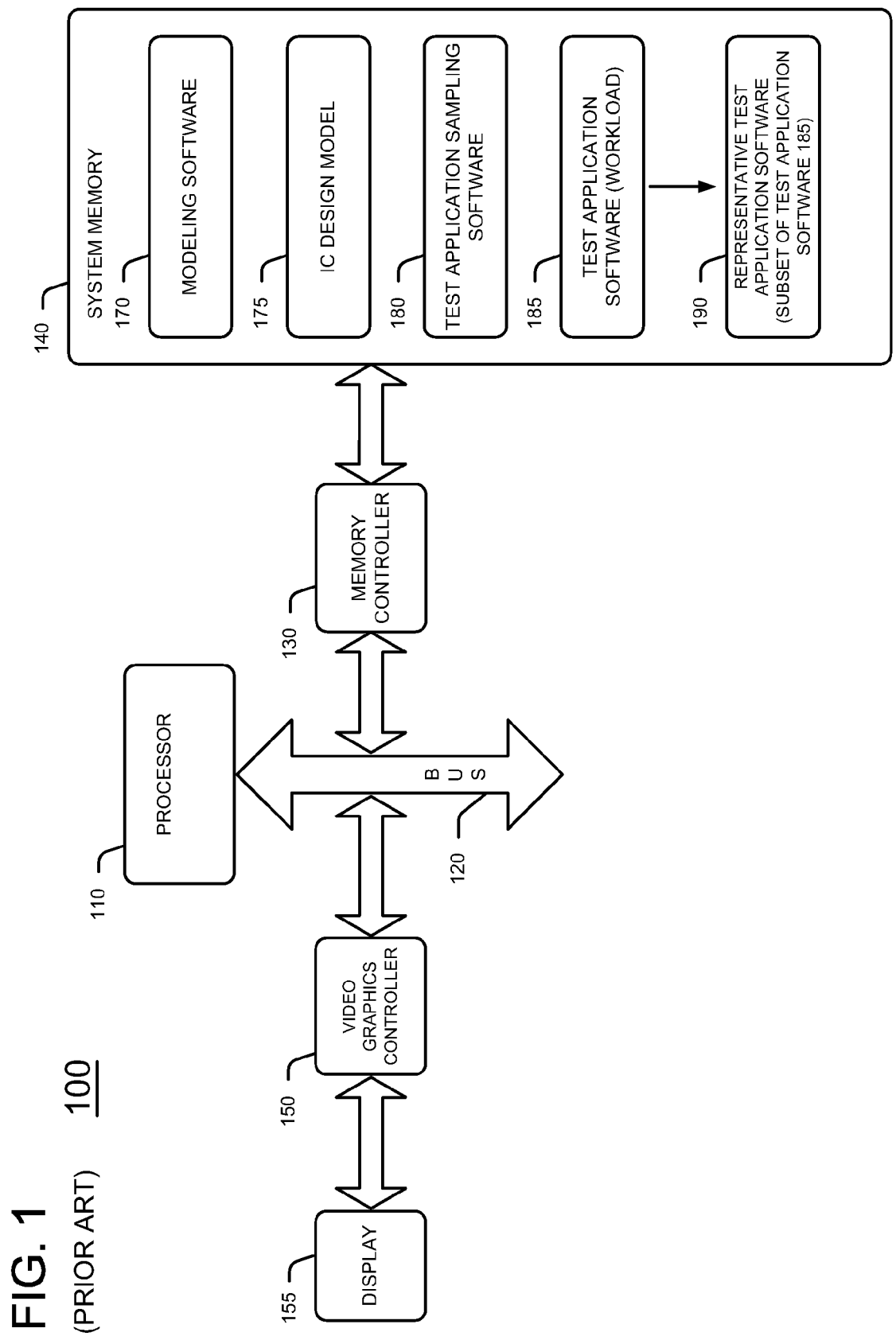
FIG. 1 is a block diagram of an information handling system that executes test application software on an IC design model.

FIG. 1 depicts a conventional test system 100 that IC designers may employ as a benchmarking tool for existing or new IC design analysis. Test system 100 includes a processor 110 that couples to a bus 120 to process information it receives via bus 120. A memory controller 130 couples a system memory 140 to bus 120. A video graphics controller 150 couples a display 155 to bus 120. System memory 140 includes modeling software 170 such as SPICE. IC designers may use SPICE or other modeling software to develop an analog and digital representation of the IC under development. System memory 140 includes such an IC design model 175. IC design model 175 represents a virtual model of the particular IC design under development, test, benchmarking, or other analysis. Designers may use modeling software 170 tools to develop IC design models for new designs or utilize previous IC design models from prior design development programs. IC design model 175 may be one output of modeling software 170.

Performance and benchmark analysis of prior IC designs may be useful in estimating the design and performance characteristics of new IC designs. For example, designers may use the results of a modeling and simulation program to benchmark or estimate the performance of the IC design even prior to fabrication of the design in hardware. Due to the large amount of data associated with IC design development, performance evaluation and benchmark tools typically provide sampling methodologies to reduce the total amount of data for evaluation. System memory 140 includes test application sampling software 180 such as "Simulation Points" (SimPoint), an open source test program promoted at the ASPLOS 2002 and ISCA 2003 conferences, developed at the University of California at San Diego (UCSD). SimPoint employs one such sampling methodology, namely trace or test software program instruction sampling.

System memory 140 also includes workload software, such as test application software 185. Test application sampling software 180, such as SimPoint, monitors the addresses of each instruction of test application software 185 during execution on IC design model 175. Other test application sampling software 180 tools, such as "Self Monitoring Analysis and Reporting Technology" (SMART) tool and Turbo SMART, identify program phase or code profile behavior in test application software 185 using instruction or trace sampling techniques. SimPoint, SMART, and Turbo SMART are examples of open source test application sampling software and, more particularly, tracer programs.

Test system 100 employs test application sampling software 180 and executes a workload, such as test application software 185, on IC design model 175. Test application software 185, or workload program, such as SPEC2000, SPEC2006, TPC-C, etc., are common industry standard test programs for use by IC designers during development and evaluation of complex IC designs. Such standard test application software provides a baseline for comparison of benchmark performance results between broad types of IC design specifications. IC designers may use test application software, such as SPEC2006, to provide an analysis of the performance characteristics of a particular IC design prior to fabrication of the IC design in hardware.

IC designers use workload programs, such as test application software 185 to contrast the performance of one IC design with another. For example, IC designers may compare the performance of one generation of the PowerPC Processor IC to a next generation PowerPC Processor IC design.

Another practical use of benchmark analysis is for the benchmark process to provide input for IC design during IC design trade-off analysis. IC design trade-off problems involving physical layout, power consumption, noise immunity and many others, consume very substantial amounts of IC development time. Benchmark analysis allows IC designers to make changes to the IC design model and to compare prior results to new results before finalizing decisions relating to small or large IC design modifications.

IC designers may also use customer user application software as test application software 185. In this manner, test system 100 may simulate a real world application wherein the IC design model executes actual user software application programs. This methodology provides IC designers and customers with early access to information relating to performance characteristics versus performance expectations of future IC designs. In one example, test application sampling software 180 executes test application software 185 and collects a grouping of instruction information or traces. Test application sampling software 180 develops groupings that depict different test application software program phases or code profile phases, such as memory read, memory writes, numerical processing, and others.

Test application sampling software 180 executes tracer programs such as SimPoint to develop a clock "Cycle Per Instruction" (CPI) analysis of test application software 185. CPI is simply the average number of processor IC design clock cycles that the instructions of test application software 185 require to complete. CPI analysis provides a baseline or control to compare modifications such as in the IC design model 175 for future analysis. For example, it is common to develop a CPI analysis for a particular IC design model 175 when executing extensive test application software 185, such as SPEC2006. IC designers may then use this CPI analysis to compare with future benchmarking analysis of new IC designs.

A CPI analysis collects CPI information for the entirety of test application software 185 on IC design model 175. Test application sampling software 180 may collect CPI data for the entire workload, such as test application software 185. In this case, test application sampling software 180 calculates CPI as the total number of clock cycles divided by the total number of instructions that execute of test application software 185. A high CPI value usually indicates IC design underutilization of resources. Test application sampling software 180 may also generate CPI data on a per instruction basis of test application software 185. Because this process may take considerable time to complete, IC designers typically execute this process only once per existing design. Of course, the designer is free to execute this process more than once if desired.

One significant purpose of CPI analysis is in comparing test results of original test application software with the test results of future representative test application software that exhibits reduced size or executable instruction length in comparison with the original test application software. The executable instruction length, or simply length, is the number of instructions of test application software, such as software 185, that execute during a predetermined instruction interval. For example, test application sampling software 180, such as SimPoint, may generate representative test application software 190. Representative test application software 190 is a subset of original test application software 185. The reduced length of representative test application software 190 offers the IC designers the opportunity to execute much faster benchmark analysis on IC designs without extensive time constraints. An IC designer may execute the representative test application software 190 on the same IC design model 175 that executes the original test application software 185. Comparing the CPI analysis of the smaller representative test application software 190 with the CPI analysis of the much larger original test application software 185 may provide a good estimate of how close the smaller representative test application software 190 comes to approximating the much larger original test application software 185.

A comparison of CPI analysis that yields 1% or lower difference typically represents a high degree of representativeness for representative test application software 190. IC designers may use such representative test application software 190 to analyze and provide useful feedback on performance prediction of design changes, such as on IC design model 175. The IC designer may use the representative test application software 190 on IC design model changes and compare the test results for IC designs before and after the changes. By using the representative test application software 190, IC design evaluation time may decrease considerably. The IC designer may speed up the IC design process and/or test more design changes. CPI analysis provides another powerful feature, namely the identification of test application software program phases, or code profiles that may be useful by IC designers and others to analyze the performance of the IC design model 175. Comparing the CPI analysis of one IC design with another IC design provides input into a method for generating an overall CPI error calculation for test application sampling software tools.

The publication "Representative Traces for Processor Models With Infinite Cache", by Iyengar, et al. (HPCA 1995) discusses R-Metric tools. R-Metric tools provides one method of measuring the representative strength of one test application software 185 in comparison with another, such as representative test application software 190, for benchmarking purposes of IC designs. For example, during execution of test application software program 185, test application sampling software 180 may monitor representative instruction execution metrics, such as data cache misses, branch prediction data, instruction execution context, and other metrics, per any given clock cycle. The difference between these instruction execution metrics for representative test application software 190 and test application software 185 provides one strength measurement that R-Metric tool generates. R-Metric tools may include other instruction execution metrics for representative strength analysis of representative test application software 190, such as CPI counts or other measures. Moreover, during execution of test application software 185, patterns such as program phases or code profiles of test application software 185 may become identifiable to designers and software benchmarking tools. Although R-Metric tools may provide strength information pertaining to representative test application software 190, this strength information may not provide sufficient guidance to make improvements in the representative strength of representative test application software 190. Unfortunately, this may lead the user to a trial and error approach for improving IC design performance using this tool.

Instructions of a typical test application software program such as test application software 185 may include machine level language instructions such as load, add, move, multiply, or other instructions. Conventional test system 100 may encounter a trillion or more instructions during execution of test application software 185. Test application sampling software 180 may organize the instructions of test application software 185 into basic blocks. Organizing the instructions of test application software 185 into such basic blocks allows test application sampling software 180 an opportunity to reduce the magnitude or total executable instruction length of the application software instruction data and to ultimately generate representative test application software 190.

Basic blocks represent unique instruction segments of the total instruction set that forms test application software 185. Basic blocks are segments or sections of program instructions from a larger test application software program, namely test application software 185, that start after a branch instruction and end with another branch instruction. Test application software 185, may provide test system 100 input for the execution of a trillion or more dynamic instructions. A dynamic instruction is any particular instruction of a software program, such as test application software 185, that executes. Compilers generate compiled instructions that execute on a particular hardware platform. Test application software 185 contains the compiled instructions for use on the IC design model 175 platform. Basic blocks may repeat multiple times within test application software 185 after a particular compiler compiles software from a programmer's higher level programming language. In summary, test application sampling software 180 operates on test application software 185 to generate representative test application software 190 that is a subset of, and thus smaller than, test application software 185.

Figure 2:
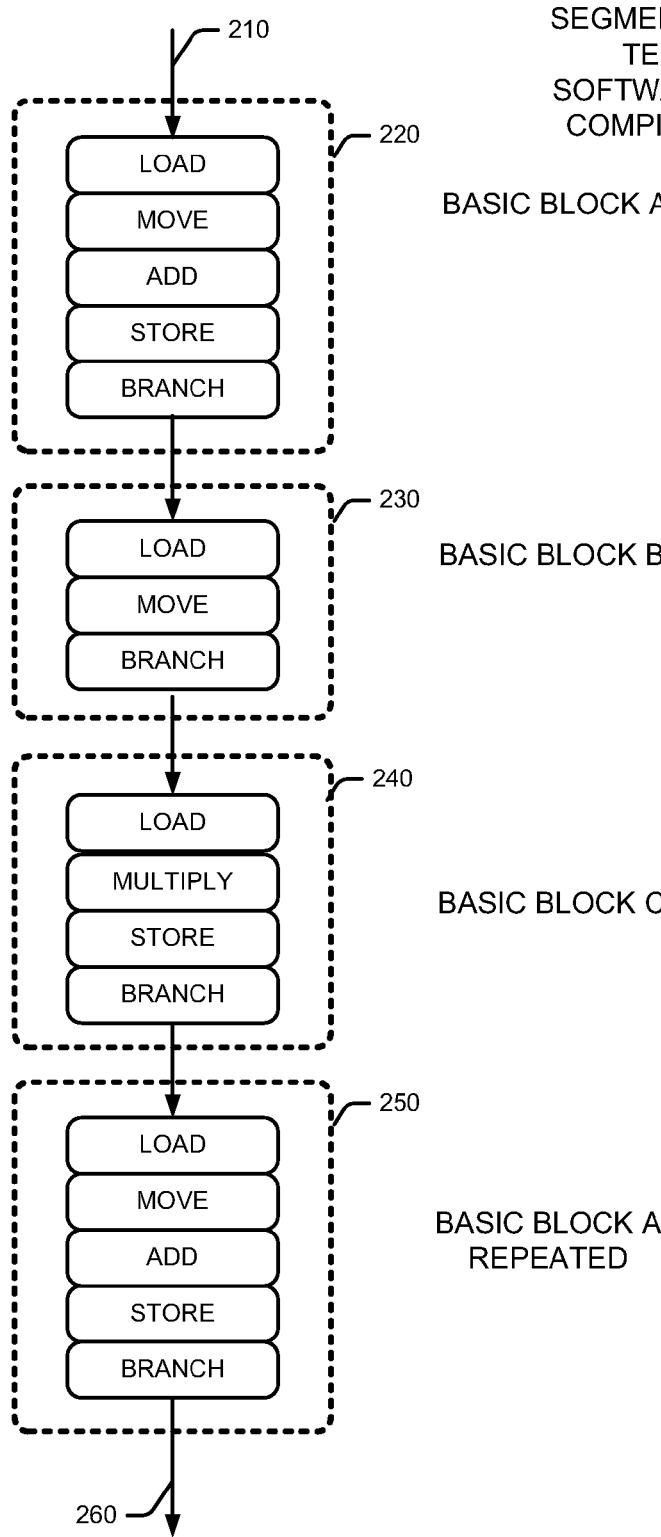
FIG. 2 depicts basic block identification from a particular segment of instructions of a larger test application software program.

FIG. 2 depicts one example of an instruction segment 200 or portion of the much larger set of dynamic instructions of a test application software program, such as test application software 185. The down arrow 210 at the top of instruction segment 200 represents a connection from a previous branch instruction of the much larger set of instructions of test application software 185. The first instruction at the top of a basic block A 220 is an assembly language or machine language load instruction, namely LOAD. Basic block A 220 includes the LOAD, MOVE, ADD, STORE and BRANCH instructions at the top of instruction segment 200.

As shown in FIG. 2, each basic block is a grouping, collection, or set of individual instructions within a larger instruction sequence. Basic blocks begin after a previous branch instruction. A basic block B 230 of instruction segment 200, follows basic block A 220 of the same instruction segment 200. Basic block B 230 includes the instructions, LOAD, MOVE, and ends with a BRANCH instruction. A basic block C 240 follows basic block B 230 of instruction segment 200. Basic block C 240 includes the instructions LOAD, MULTIPLY, STORE and BRANCH.

As with many test application software programs, test application software 185 includes a large amount of identical basic blocks. In the example of FIG. 2, one such identical basic block is a basic block A 250 that is identical to basic block A 220. Basic block A 250 follows basic block C 240 in the instruction set of instruction segment 200 and includes LOAD, MOVE, ADD, STORE and BRANCH instructions in sequence. During execution of test application software 185, test application sampling software 180 may detect the second execution of basic block A 220 as basic block A 250 and record an execution count of 2 for that particular basic block during instruction segment 200. Basic block execution counts may provide test application sampling software 180 with an opportunity for overall dynamic instruction length reduction in the generation of representative test application software 190.

After basic block A 250, as per the down arrow 255 at the bottom of instruction segment 200, instruction sequencing continues to the larger test application software 185 and further instruction segments and basic blocks not shown. Within test application software 185, basic block A 220 or other basic block may repeat due to test application branches, jumps, or other reasons. Repetition of multiple basic blocks in sequence may provide insight into repetitious execution program phases of test application sampling software 180, and may further provide opportunities for total instruction count reduction of representative test application software 190.

As stated above, test application software programs are typically very large, often including more than a trillion individual instructions. Basic blocks, such as the basic blocks of FIG. 2, provide input into one methodology to reduce the total amount of information such as instruction counts for software simulation, benchmark, and performance tools. For example, since basic blocks repeat multiple times within a typical test application software program, test application sampling software 180 may treat basic blocks as the primary unit of measure during execution of test application software 185 and further analysis of IC design model 175. In other words, test application sampling software 180 may collect the execution count or number of times that common basic blocks, such as basic block A, execute during the execution of test application software 185 on IC design model 175. A basic block vector (BBV) is a data structure including execution counts that represent the number of times that a particular basic block repeats or executes during testing of test application software 185. Each unique basic block that application software 185 executes corresponds to a unique location and provides input into the formation of each basic block vector (BBV).

One known method for generating BBVs involves executing a test application software program, such as test application software 185, in a virtual environment that test system 100 with its IC design model 175 provides. Test application software 185 exhibits a dynamic instruction count that describes the program executable instruction length. More specifically, the compiled code of test application software 185 includes a start and a finish. Test application sampling software 180 executes test application software 185 from start to finish. An IC designer or other entity tests the virtual design of an IC or semiconductor die design per IC design model 175 by executing test application sampling software 180 with test application software 185 in test system 100. The IC designer or other entity performs this test with IC design model 175 loaded in system memory 140.

Test application sampling software 180 may detect program phases such as code profiles of test application software 185 that execute on IC design model 175. Program phases may include numerical computations, repetitive graphical operations, processor disk load/store operations, register read/write operations or other operations. Designers and other entities may look for patterns in the CPI analysis that may reflect areas that exhibit similar performance characteristics during software program operation. Program phase analysis is an important tool that test application sampling software 180 and IC designers may employ to reduce overall application software program review by eliminating or combining similar program phases.

Test application sampling software 180 uses BBV analysis to reduce the total length of test application software 185 and generate reduced or representative test application software 190 therefrom. Representative test application software 190 is a subset of, and thus exhibits fewer executing instructions than, test application software 185. Since representative test application software 190 has fewer executing instructions than test application software 185, representative test application software 190 executes faster than test application software 185 in the virtual test environment of conventional test system 100. The test application sampling software 180 may generate output data to demonstrate the design performance characteristics of the virtual IC design model 175 using the representative test application software 190. Designers may interpret the results of the test application sampling software 180 to determine if design guidelines are met, or if redesign efforts in hardware, software, or other design areas are needed.

In one case, test application sampling software 180 executes test application software 185 on a virtual design model, namely IC design model 175, that test system 100 loads. Test application software 185 may be industry workload software or special test software for execution and demonstration of particular areas of IC design model 175. Test application software 185 may be user software that end customers plan on using on a real product or production prototype of IC design model 175. Test application sampling software 180 processes test application software 185 (i.e. workload software) to generate reduced-length representative test application software 190 therefrom.

In one example, test application sampling software 180 evaluates each 10 million instructions of execution of test application software 185 until either test application software 185 ends, or until the designer or other entity halts execution of application software 185. Each 10 million instructions represents one example of an instruction interval that designers may assign as the primary instruction count size to evaluate during execution of test application software 185. An instruction interval is a size in dynamic instructions and not a period of time of execution of test application software 185. Test application sampling software 180 executes and evaluates the first instruction interval of 10 million instructions of test application software 185 and keeps track of each unique basic block that test application sampling software 180 encounters during that execution.

Figure 3:
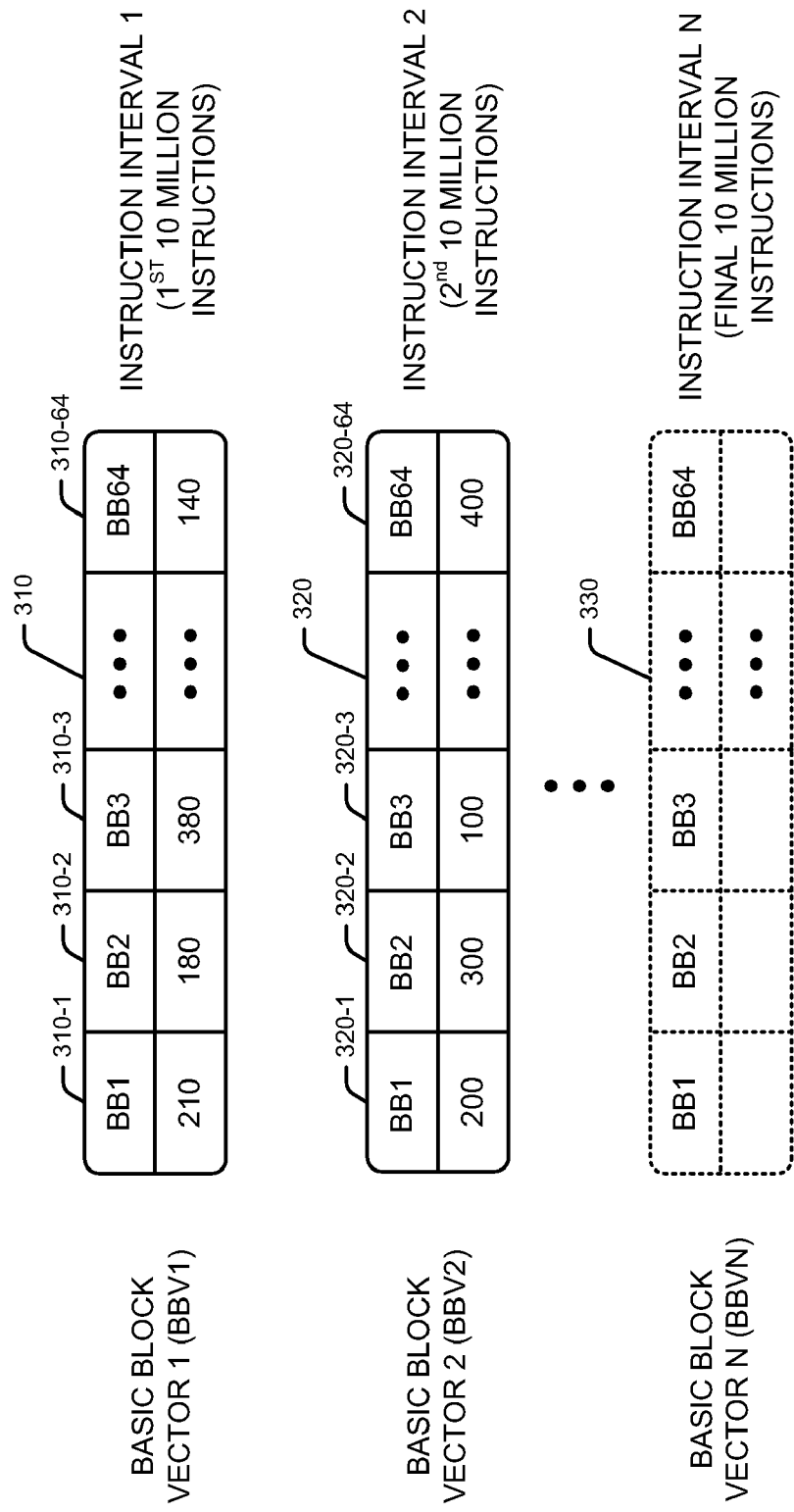
FIG. 3 is a representation of multiple basic block vectors that one IC design model evaluation methodology generates.

FIG. 3 shows one example of a conventional basic block vector (BBV) format 300 that test application sampling software, such as test application sampling software 180, may generate. A basic block vector BBV1 310 includes the results of the first instruction interval, namely instruction interval 1, of 10 million instructions that execute when test application software 185 executes on IC design model 175. Each cell of BBV1 310 in the top row of data includes a respective basic block identifier, namely basic block identifiers for basic blocks BB1 to BB64, or 64 unique basic blocks. Below each unique basic block identifier is the bottom row of data including the respective execution count or number of repetitions of each unique basic block when the application software 185 executes on a test system or simulator 100. For example, BBV1 310 includes column 310-1 that describes basic block BB1 and its respective execution count of 210. In other words, in this example basic block BB1, such as basic block A 220 of FIG. 2, executes 210 times. In more detail, basic block BB1 executes 210 times within instruction interval 1, or the first instruction interval of 10 million execution instructions of test application sampling software 180.

The next unique basic block that the test application sampling software 180 executes in instruction interval 1 is basic block BB2. As shown in column 310-2, basic block BB2 executes 180 times during the first 10 million instructions of execution of test application software 185. Column 310-3 shows basic block BB3 and a respective execution count of 380, and so forth until basic block BB64 executes 140 times as shown in column 310-64. In this example, test application sampling software 180 identifies a total count of 64 unique basic blocks, namely those of BB1 in column 310-1 through BB64 of column 310-64. Basic block vector BBV1 310 is complete or full of data when the test application sampling software 180 executes the entirety of the first instruction interval of 10 million instructions of test application software 185.

Each entry in the data fields of the bottom row of BBV1 310 represents the number of executions of a respective basic block immediately above. The basic block vector BBV includes a significantly smaller amount of data than the 10 million instructions that test application sampling software 180 uses to create the basic block vector BBV. The BBV provides a dramatic reduction opportunity in data for evaluation of application software and hardware performance on a particular IC design model without dramatically reducing the significance or value of that data to the IC design benchmarking process.

In one example, basic blocks BB1 310-1 through BB64 310-64 of basic block vector BBV1 310 represent the entire unique set of basic blocks that test application sampling software 180 executes. In that case, the basic blocks of a basic block vector BBV2 320 are identical to those of BBV1 310 and include a total of 64 basic blocks. After executing the instructions of instruction interval 1, test application sampling software 180 executes the next instruction interval 2 of 10 million instructions of application software 185 to generate the next basic block vector, namely BBV2 320. Each cell of BBV2 320 in the top row of data includes a respective basic block identifier, namely basic block identifiers for basic blocks BB1 through BB64 that identify 64 unique basic blocks. Below each basic block identifier is a respective execution count or number of repetitions of the corresponding basic block. These execution counts or repetitions form the bottom row of data of basic block vector BBV2 320. BBV2 320 includes column 320-1 that shows basic block BB1 and a respective execution count of 200. In other words, in this example of instruction interval 2, basic block BB1 in column 320-1 shows that that test application sampling software 180 encounters and executes basic block BB1 200 times.

As seen in column 320-2 of BBV2 320, test application sampling software 180 executes basic block BB2 300 times during instructions interval 2 of test application software 185. Column 320-3 shows basic block BB3 and an execution count of 100, and so forth, until basic block BB64 executes 400 times as seen in column 320-64. Basic block vector BBV2 320 is complete or full of data when the test application sampling software 180 executes the entirety of the second 10 million instructions of test application software 185. Each entry in the data fields of the bottom row of basic block vector BBV2 320 represents the execution of a particular basic block. In the case of BBV2 320, the total number of basic blocks remains the same as BBV1 310, namely 64 unique basic blocks. However, the basic block execution counts, as seen in the bottom row of each BBV, namely BBV1 310 through BBVN 330, differ because of the non-repetitive nature of application software instructions, such as test application software 185. Any 10 million application software instructions are likely to have a unique set of total basic block execution counts.

As test application sampling software 180 generates basic block vectors (BBVs), each BBV becomes a unique set of data that is useful for understanding application software flow. BBVs take on a data form that closely correlates to the program phase that the test application software 185 executes during their formation. For example, BBV1 310 may represent a memory read/write operation. In that case, BBV1 310 provides a higher level structure than the detailed instructions that supply the input to form BBV1 310. BBV1 310 includes much less data than the 10 million instructions that test application sampling software 180 evaluates during construction of basic block vector BBV1 310. By grouping similar BBVs, test application sampling software 180 may further reduce the total amount of data that designers use to evaluate the performance of a particular IC design model 175.

Test application sampling software 180 continues execution with the next set of 10 million instructions populating a BBV3, BBV4, etc. (not shown), until finally generating a basic block vector BBVN 330, wherein N is the total number of basic block vectors. In other words, BBVN 330 is the last in the series of BBVs that the test application sampling software 180 evaluates during execution of test application software 185. BB1, BB2, BB3, . . . BB64 of basic block vector BBVN represent the unique basic blocks that the test application sampling software 180 evaluates during the final 10 million count of instructions of the test application software 185.

BBVN 330 populates in the same fashion as BBV1 310 and BBV2 320 as described above. BBVN 330 is the final BBV that test application sampling software 180 generates because the test application software 185 completes or designers select a stop point. Typical application software 185 may generate hundreds of BBVs. The BBV count may vary due to the application software program length, sampling interval length, BBV format, and other parameters. Although the example of FIG. 3 utilizes a BBV generation length or instruction interval of 10 million instructions, and a BBV basic block count of 64, test application sampling software 180, simulation tools, designers, and other entities may select other numerical counting methods.

BBVs are a representative sample of the test application software 185 that executes on a virtual IC design model 175. Test application sampling software 180 executes a clustering tool program such as SimPoint or other clustering tool that may use the BBV data to establish clusters of similar BBVs, and thus clusters or groups of similar instruction intervals. Conventional test application benchmark and sampling tool software 180 may choose the most representative instruction interval in a cluster to represent the entire cluster. Conventional test application and sampling tool software, such as test application sampling software 180, may offer a reduction in overall data for other software tools to use in the aid of IC design development, and may enable faster IC design analysis than other more detailed transistor and component level simulations.

Test sampling software 180, such as SimPoint software including BBV generation as shown above in FIG. 3, captures the program phase, or code profile changes due to changes in program control flow. A program phase represents a particular sequence of basic blocks relating to the interaction of hardware and software on IC design model 175. One limitation of conventional test application software 180 is that conventional test application sampling software may not capture program phase changes that occur as the result of IC design model 175 microarchitecture dependent events. One such capture weakness is the case wherein particular microarchitecture dependent events do not change the control flow of test application software 185 directly. In that case, those particular microarchitecture dependent events may change the instruction or data cache miss rates of test application software 185. Those particular microarchitecture dependent events may differ for the unique microarchitecture elements of IC design model 175 under evaluation. Such microarchitecture dependent characteristics may be lost in the conventional basic block vector (BBV) format 300 of FIG. 3.

Microarchitecture dependent information may include data cache misses, branch mispredictions, or any other event that causes a cycle per instruction (CPI) error due to microarchitecture elements of IC design model 175. In one embodiment of the disclosed testing methodology, enhanced test application sampling software 404, described below with reference to FIG. 4, may collect microarchitecture dependent information "on-the-fly" or in real time operation of a test application software program 485.

FIG. 4 shows one embodiment of the disclosed test system 400 that an IC designer may employ as an IC design simulation and benchmarking tool. Test system 400 includes a computer program product 402, such as a media disk, media drive or other media storage. Test system 400 also includes enhanced test application sampling software 404 that enables IC designers to develop software to perform benchmarking of IC designs. Enhanced test application sampling software 404 may include multiple programs such as tracer or other programs for monitoring information about a particular test application software program's execution. Enhanced test application sampling software 404 includes fly-by vector (FBV) generation and analysis programs. Enhanced test application sampling software 404 may include instruction and basic block clustering programs or other programs to support IC design analysis, development and performance modeling.

Enhanced test application sampling software 404 acts as workload reduction software (WRS), as described in more detail below. Enhanced test application sampling software 404 may collect microarchitecture dependent information "on-the-fly" and create a database with this real-time or fly-by information. Test application sampling software 404 may store the microarchitecture dependent fly-by information for each instruction interval in a special vector called a fly-by vector (FBV). The FBV is a collection of microarchitecture dependent information that enhanced test application sampling software 404 generates during each instruction interval execution of test application software program 485. The FBV format is described in more detail below.

The disclosed test system 400 generates and evaluates FBVs that include microarchitecture dependent information as explained in more detail below. Test system 400 includes a processor 410 that includes a master processor core 412. Master processor core 412 couples to an L1 cache 415, and a hardware counter group 418. Processor 410 also couples to a bus 420. A memory controller 430 couples a system memory 435 to bus 420. A video graphics controller 440 couples a display 445 to bus 420. Test system 400 includes nonvolatile storage 450, such as a hard disk drive, CD drive, DVD drive, or other nonvolatile storage that couples to bus 420 to provide test system 400 with permanent storage of information. System memory 435 and nonvolatile storage 450 are each a form of data store. I/O devices 460, such as a keyboard and a mouse pointing device, couple via an I/O controller 465 to bus 420.

One or more expansion busses 470, such as USB, IEEE 1394 bus, ATA, SATA, PCI, PCIE and other busses, couple to bus 420 to facilitate the connection of peripherals and devices to test system 400. A network interface 475 couples to bus 420 to enable test system 400 to connect by wire or wirelessly to other network devices. Test system 400 may take many forms. For example, test system 400 may take the form of a desktop, server, portable, laptop, notebook, or other form factor computer or data processing system. Test system 400 may also take other form factors such as a personal digital assistant (PDA), a gaming device, a portable telephone device, a communication device or other devices that include a processor and memory.

Test system 400 may employ a compact disk (CD), digital versatile disk (DVD), floppy disk, external hard disk or virtually any other digital storage medium as medium 402.

Medium 402 stores software that includes enhanced test application sampling software 404 thereon. A user or other entity installs software such as enhanced test application sampling software 404 on test system 400 prior to conducting testing with the enhanced test application sampling software 404. The designation, enhanced test application sampling software 404', describes enhanced test application sampling software 404 after installation in non-volatile storage 450 of test system 400. The designation, enhanced test application sampling software 404", describes enhanced test application sampling software 404 after test system 400 loads the enhanced test application sampling software 404 into system memory 435 for execution.

An IC design model 480 is a database of timing and other characteristics of a virtual IC design or virtual semiconductor die design for use by enhanced test application sampling software 404. IC design model 480 is a cycle accurate processor model that provides a clock cycle per instruction (CPI) accurate representation of a particular IC design. A workload or test application software 485 is a program or set of instructions for use by enhanced test application sampling software 404 to simulate the execution of benchmarking test application software 485 on an IC model such as IC design model 480. Enhanced test application sampling software 404 is a software simulation and benchmarking tool. Enhanced test application sampling software 404 may include a software simulation tool program, such as SimPoint, or other modeling software program to provide instruction trace analysis in test system 400. Test system 400 executes enhanced test application sampling software 404 to evaluate IC design characteristics of IC design model 480 for performance and other analysis.

IC design model 480 loads on non-volatile storage 450 from another test system or other entity prior to execution of enhanced test application sampling software 404. In a similar fashion, test application software 485 loads on non-volatile storage 450 from another test system or other entity prior to execution of enhanced test application sampling software 404. The designation, IC design model 480', describes the IC design model 480 after test system 400 loads the IC design model 480 and enhanced test application sampling software 404 into system memory 435 for execution. Similarly, the designation, test application software 485', describes the test application software 485 after test system 400 loads the test application software 485 into system memory 435 for execution on the IC design model 480'.

Enhanced test application sampling software 404 generates a representative workload, such as representative test application software 490, during execution and evaluation of test application software 485. The executable instruction length, or simply length, is the number of instructions of test application software, such as software 485 or 490, that execute during a predetermined instruction interval. Enhanced test application software 404 is thus workload reduction software (WRS) in that it employs test application software or workload 485 as input and provides reduced representative test application software 490 as output. Reduced representative test application software 490 exhibits a number of dynamic or executable instructions less than test application software or workload 485. In other words, the executable instruction length of the reduced representative test application software 490 is less than the executable instruction length of the original test application workload 485. Test system 400 is a cycle accurate, trace driven simulator that executes instruction interval samples of a particular instruction length. In one example of the disclosed methodology, enhanced test application sampling software 404 reduces the total instruction count of test application software 485 into a smaller representative version of that test application software, namely representative test application software 490. Representative test application software 490 is a representative subset of test application software 485. The representative test application software 490 may store in system memory 435 for execution within test system 400. Enhanced test application sampling software 404" may execute and evaluate the performance characteristics of representative test application software 490 on an IC design model such as IC design model 480.

In one embodiment, enhanced test application sampling software 404 implements the disclosed methodology as a set of instructions (program code) in a code module which may, for example, reside in the system memory 435 of test system 400 of FIG. 4. Until test system 400 requires this set of instructions, another memory, for example, non-volatile storage 450 such as a hard disk drive, or a removable memory such as an optical disk or floppy disk, may store this set of instructions. Test system 400 may also download this set of instructions via the Internet or other computer network. Thus, a computer program product may implement the disclosed methodology for use in a computer such as test system 400. In such a software embodiment, RAM or system memory 435 may store code that carries out the functions described in the flowchart of FIG. 9 below while processor 410 executes such code. In addition, although the various methods described are conveniently implemented in a general purpose computer selectively activated or reconfigured by software, one of ordinary skill in the art would also recognize that such methods may be carried out in hardware, in firmware, or in more specialized apparatus constructed to perform the required method steps.

FIG. 5 depicts a fly-by vector format, namely FBV format 500 that shows the independent FBV microarchitecture dependent data corresponding to each BBV. Each BBV representative of an instruction interval of 10 million instructions of test application software 485 has a corresponding FBV. For example, a BBV1 510 representing instruction interval 1, namely the first 10 million instructions of test application software 485, has a corresponding FBV1 515. Stated alternatively, during execution and analysis of test application software 485, enhanced test application sampling software 404 generates both BBV1 510 and FBV1 515 independently. As shown by the arrow between BBV1 510 and FBV1 515, both vectors have instruction interval 1 in common.

Enhanced test application sampling software 404 may collect microarchitecture dependent information on-the-fly, namely in real time, during the execution of test application software 485. Test system 400 may generate and store the microarchitecture dependent information or data temporarily in one of multiple hardware counters, such as those of hardware counter group 418 in FIG. 4. Other memory locations, such as system memory 435, or other memory of test system 400 may store the microarchitecture dependent information for later analysis by enhanced test application sampling software 404.

Returning to FIG. 5, FBV format 500 demonstrates the association of both BBV1 510 and a respective FBV1 515 that enhanced test application sampling software 404 generates from the same instruction interval. In this example, enhanced test application sampling software 404 utilizes an instruction interval value size or length of 10 million instructions. In actual practice, the instruction interval may exhibit a predetermined value greater than or less than 10 million instructions depending on the particular application, the amount of testing time available and other parameters. FBV1 515 includes microarchitecture dependent information of test application software 485 that executes on IC design model 480. For example, FBV1 515 may contain the miss rate data for a data cache, such as L1 cache 415 during instruction interval 1, namely the first instruction interval of test application software 485.

In another embodiment, FBV1 515 may include information such as data cache miss counts for L1 cache 415, branch misprediction counts, or other microarchitecture dependent data. In other embodiments of the disclosed methodology, FBV1 515 may contain combinations of types of microarchitecture dependent information such as data cache miss count, branch misprediction counts, CPI, and other microarchitecture dependent information that enhanced test application sampling software 404 generates during execution on a per instruction interval basis.

Fly-by vector format 500 of FIG. 5 includes some structures in common with conventional basic block vector format 300 of FIG. 3. For example, enhanced test application sampling software 404 may generate BBV1 510 in a manner similar to the generation of BBV1 310 of FIG. 3. However, format 500 contains microarchitecture dependent information in a fly-by vector (FBV) format that conventional basic block vector format 300 does not. As seen in FIG. 5, FBV1 515 includes microarchitecture dependent information that enhanced test application sampling software 404 generates. In particular, enhanced test application sampling software 404 generates FBV1 515 from the first 10 million instructions, or first instruction interval, namely instruction interval 1, of test application software 485. In one embodiment, enhanced test application sampling software 404 generates fly-by vector 1 (FBV1) concurrently with executing the 10 million instructions of instruction interval 1.

A basic block vector BBV1 510 includes the results of the first 10 million instructions that execute of test application software 485 executing on IC design model 480. Each cell of BBV1 510 in the top row of data includes a respective basic block identifier, namely basic block identifiers for basic block BB1 to BB128. Below each basic block identifier is the bottom row of data including the respective execution count or number of repetitions of each basic block when the application software executes on a test system 400 or simulator. For example, BBV1 510 includes column 510-1 that describes basic block BB1 and its respective execution count of 240. In other words, in this example the first basic block that enhanced test application sampling software 404 encounters in execution of test application software 485 is BB1, and basic block BB1 executes 240 times within the first 10 million execution instructions, namely instruction interval 1.

The next unique basic block that the enhanced test application sampling software 404 encounters in the first 10 million instructions of instruction interval 1 is basic block BB2 that executes 320 times during the execution of test application software 485, as shown in column 510-2. Column 510-3 shows basic block BB3 and a respective execution count of 60, and so forth until basic block BB128 executes 440 times as shown in column 510-128. In this embodiment, enhanced test application sampling software 404 identifies a total count of 128 unique basic blocks, namely BB1 in column 510-1 through BB128 in column 510-128.

In this particular example, a total of 128 unique basic blocks, namely BB1 through BB128, are the only basic blocks that enhanced test application sample software 404 detects and analyses over the total length of test application software 485. The total count of basic blocks may vary due to test application software content, execution methodologies and other factors. Basic block vector BBV1 510 is complete or full of data when the enhanced test application sampling software 404 executes the entirety of the first 10 million instructions in instruction interval 1 of test application software 485. Each entry in the data fields of the bottom row of BBV1 510 represents the number of executions of a respective basic block immediately above.

Data cache misses of IC design model 480 during execution of test application software 485 are one example of microarchitecture dependent information. Microarchitecture dependent information may be any information that enhanced test application sampling software 404 collects that indicates a performance effect from the instruction execution of application software, such as test application software 485. For example, a cache miss may potentially stall or delay the execution of test application software 485 during enhanced test application sampling software 404 execution and analysis. Enhanced test application sampling software 404 may capture or collect information such as clock cycle delays that this potential stall or delay of test application software 485 incurs. In one embodiment, the clock cycle delays of a cache miss provide the microarchitecture dependent information for analysis by enhanced test application sampling software 404.

After completing execution of the 10 million instructions of instruction interval 1, enhanced test application sampling software 404 executes the next set of 10 million instructions of test application software 485, namely instruction interval 2, to generate the next basic block vector and corresponding fly-by vector, namely a BBV2 520 and FBV2 525 respectively. Each cell of BBV2 520 in the top row of data includes a respective basic block identifier, namely basic block identifiers for basic blocks BB1 to BB128. These basic blocks in BBV2 520, namely BB1 to BB128, are the same basic blocks that BBV1 510 contains. Below each basic block identifier is a respective execution count or number of repetitions of the corresponding basic block. These execution counts or repetitions form the bottom row of data of basic block vector BBV2 520. BBV2 520 includes column 520-1 that shows basic block BB1 and a respective execution count of 180. In other words, in this example when enhanced test application sampling software 404 executes the 10 million instructions of instruction interval 2 of test application software 485, BB1 executes 180 times. During generation of BBV2 520, enhanced test application sampling software 404 generates FBV2 525 that corresponds to the analysis of microarchitecture dependent information of the 10 million instructions of instruction interval 2 of test application software 485.

Some of basic blocks BB1 through BB128 may not execute in every instruction interval. For example, BB2 in BBV2 520 does not occur during the 10 million instructions of instruction interval 2 of application software execution, as shown in column 520-1. Column 520-2 shows an execution count for BB2 of 0. Column 520-3 shows basic block BB3 and an execution count of 600, and so forth until basic block BB128 executes 200 times as seen in column 520-128. Basic block vector BBV2 520 is complete or full of data when the enhanced test application sampling software 404 executes the entirety of the 10 million instructions of instruction interval 2 of test application software 485. Each entry in the data fields of the bottom row of basic block vector BBV2 520 represents the execution of a particular basic block.

In the case of BBV2 520, the total number of basic blocks remains the same as BBV1 510, namely 128 unique basic blocks. However, the basic block execution counts, as seen in the bottom row of each BBV, namely BBV1 510 through BBVN 530, differ because of the nonrepetitive nature of application software instructions, such as test application software 485. Any 10 million application software instructions are likely to have a unique set of total basic block execution counts. Microarchitecture dependent information is likely to change from FBV1 to FBV2, and so on, since microarchitecture dependent information relies heavily on program execution of test application software 485 that may be very unpredictable from one fly-by vector to another. In one embodiment, FBV2 525 includes microarchitecture dependent information that enhanced test application sampling software 404 generates from miss rate data that data caches, such as L1 cache 115 may supply.

As the enhanced test application sampling software 404 generates BBVs, each BBV becomes a unique set of data that is useful for understanding microarchitecture independent application software flow. BBVs take on a data form that closely relates to the instruction address flow of test application software 485, and thus the program phases or code profile phases that the test application software 485 executes during BBV formation. For example, BBV1 510 may represent a memory read/write operation and provides a higher level structure than the detailed instructions that provide the input for enhanced test application sampling software 404. BBV1 510 includes much less data than the 10 million instructions that enhanced test application sampling software 404 evaluated during construction of BBV1 510. By grouping similar BBVs, enhanced test application sampling software 404 may further reduce the total amount of data that designers use to evaluate the performance of a particular IC design model 480.

Alternatively, as the enhanced test application sampling software 404 generates FBVs, each FBV becomes a unique set of data that is useful for understanding microarchitecture dependent application software flow. FBVs take on a data form that closely relates to microarchitecture dependent performance, and thus program phases that the test application software 485 exhibits during their formation. For example, FBV1 515 may represent a memory read/write operation wherein the data cache miss rate is extremely high. Thus, FBV1 515 provides a higher level structure than the detailed instructions of a particular instruction interval that enhanced test application sampling software 404 employs during generation of FBV1 515. Enhanced test application sampling software 404 may use the microarchitecture dependent information of FBV1 515 to enhance the respective data independent information already available from the corresponding BBV1 510 data.

Enhanced test application sampling software 404 continues with the next sets of 10 million instructions populating a BBV3, a BBV4, etc. (not shown), until finally generating a basic block vector BBVN 530, wherein N is the total number of basic block vectors in the test application software 485 or workload. Enhanced test application sampling software 404 also continues populating FBV3, FBV4, etc. (not shown), until finally generating a fly-by vector FBVN, wherein N is the total number of fly-by vectors in the test application software 485 or workload. In other words, BBVN 530 and its respective FBVN 535 are the last in the series of vectors that the enhanced test application sampling software 404 generates during execution of the last instruction interval of 10 million instructions of test application software 485. BB1, BB2, BB3 ... BB128 of BBVN represent the basic blocks that the enhanced test application sampling software 404 evaluates for the last instruction interval, namely instruction interval N of 10 million count of instructions of test application software 485.

When enhanced test application sampling software 404 executes the final 10 million instruction count, namely instruction interval N, test application sampling software 404 generates BBVN 530 wherein N is the total number of instruction intervals of test application software 485. BBVN 530 and the respective FBVN 535 populate fly-by format 500 in the same manner that BBV1 510 and FBV2 515 populate fly-by format 500 as described above. BBVN 530 and FBV 535 are the final or last BBV and respective FBV that the enhanced test application sampling software 404 generates. Enhanced test application sampling software 404 may generate hundreds of BBVs and corresponding respective FBVs. The BBV and FBV count may vary due to the test application software program 485 length, sampling instruction interval length, program run times, and other parameters.

FIG. 6 shows fly-by vector FBV examples 600 of FBV1 of FIG. 5 above. FBV examples 600 include microarchitecture dependent information from instruction interval 1 that enhanced test application sampling software 404 generates. In one embodiment, enhanced test application sampling software 404 generates the FBV examples of FIG. 6 during execution of test application software 485 on IC design model 480. FBV1 515 may include L1 cache 415 misses microarchitecture dependent information, namely FBV1-1 610. FBV1-1 610 is one example of FBV1 515 wherein the microarchitecture dependent information that enhanced test application sampling software 404 generates during execution of the first instruction interval of test application software 485 is an L1 cache 415 miss count of 20. In other words, during the execution of instruction interval 1, test application software 485 encounters 20 L1 cache 415 misses. In this example, FBV1-1 610 replaces FBV1 515 and corresponds to instruction interval 1 and BBV1 510 as seen in the example of FIG. 5 above.

In another embodiment of a method for generating FBV1 515, FBV1-2 620 of FIG. 6 depicts a fly-by vector that includes microarchitecture dependent information with L1 cache 415 misses and branch misprediction counts. During the execution of instruction interval 1, test application software 485 encounters 18 L1 cache 415 misses and 22 branch misprediction events. Enhanced test application sampling software 404 captures the microarchitecture dependent information in fly-by vector FBV1-2 620. Another example of FBV1 515, namely FBV1-3 630, includes three microarchitecture dependent information data elements. FBV1-3 630 includes data elements for L1 cache 415 misses, branch misprediction misses, and data effective to real address translation (DERAT) misses. In other words, during instruction interval 1, test application software 485 encounters 24 L1 cache 415 misses, 10 branch mispredictions, and 4 DERAT misses.

Each microarchitecture dependent data element in FIG. 6 results from the interaction of microarchitecture dependent elements of IC design model 480 and test application software 485. As instructions of test application software 485 execute on IC design model 480, enhanced test application sampling software 404 measures microarchitecture dependent information as a simulation result. Although the examples of FIG. 6 demonstrate particular types of microarchitecture dependent information, enhanced test application sampling software 404, simulation tools, designers, and other entities may select any other particular microarchitecture dependent information and corresponding FBV format.

FIG. 7 shows a clustering or BBV cluster map diagram 700 that depicts one methodology for grouping basic block vectors (BBVs) into clusters. BBV cluster map diagram 700 is a visual representation of one method that enhanced test application sampling software 404 employs to cluster or group instruction interval data, such as BBVs during execution and analysis of test application software 485. Each cluster data point, as seen by a small circle such as circle 710 on the BBV cluster map diagram 700, denotes one BBV of the collection of vectors that enhanced test application sampling software 404 generates during the execution and analysis of test application software 485. Stated alternatively, each cluster data point, such as circle 710, represents one instruction interval, such as 10 million instructions of instruction interval 1, that enhanced test application sampling software 404 executes and analyzes.

Each BBV corresponds to one sampling instruction interval, such as 10 million instructions, of the basic block analysis of IC design model 480. For example, BBV1 510 of FIG. 5 may represent one unique cluster data point on BBV cluster map diagram 700. In this example, a cluster such as BBV cluster BBVC1 720 contains a grouping of BBVs. A cluster data point, as seen by a small circle such as circle 730, on the BBV cluster map diagram 700, denotes one BBV of a BBV cluster BBVC2 740. Cluster data point 730 denotes one BBV and thus one instruction interval of the collection of BBVs that enhanced test application sampling software 404 generates during the execution and analysis of test application software 485. In this example, BBV cluster BBVC2 740 includes a grouping of BBVs. In this example, a BBV such as BBV2 520 is shown as one of multiple BBV cluster data points of BBV cluster BBVC2 740.

By properly choosing the X axis and Y axis parameters, BBVs may group or cluster together in relationships that directly link to program phases that occur during the execution of test application software 485. For example, a cluster BBVC3 750 may represent another of multiple clusters, such as the BBV clusters. A cluster BBVC4 760 may represent yet another BBV cluster, and a cluster BBVC5 770 may represent still another BBV cluster of multiple BBV clusters. The total number of clusters, such as the BBV clusters of BBV cluster map diagram 700, may depend on the algorithm that enhanced test application sampling software 404 employs to identify clusters of test application software 485, as well as other factors.

In FIG. 7 feature 1 and feature 2 respectively represent the X and Y axis parameters of the BBV cluster map diagram 700 that enhanced test application sampling software 404 may generate. The feature 1 and feature 2 parameters provide feature selection or sorting of BBVs by workload characterization graphing. Workload characterization graphing provides a method of performance modeling by program phase of IC design model 480 while executing test application software 485. One such workload characterization method is the K-Means clustering analysis method developed at the University of California Berkeley utilizing Manhattan Distance cluster data point calculations. Manhattan Distance measurement provides for analysis of cluster data points by calculating the sum of the absolute difference of each of their coordinates from one another. In other words, the distance between two cluster data points is the sum of the orthogonal coordinate distance between the points.

K-Means clustering provides a method of grouping or partitioning a large data set into subsets or clusters such that the data in each subset share a common set of traits. K-Means clustering may provide this method for grouping the BBV results of the execution of test application software 485 by enhanced test application sampling software 404. For example, BBV cluster BBVC1 720 is a grouping of particular BBVs that may represent the operational program phase for processing a graphical object transformation on a graphics display, such as display 445. In this example, the common trait is graphical object processing instructions or basic blocks of those particular BBVs. A cluster BBVC2 740 may represent a cluster or grouping of different particular BBVs that corresponds to instructions that further execute read and write operations to memory, such as system memory 435. In this example, the common trait is "read and write" instructions of the basic blocks with corresponding basic block execution counts of BBVC2 740.

The BBV cluster map diagram 700 of BBVs presents unique opportunities to reduce the overall benchmarking complexity by reducing the amount of data that enhanced test application sampling software 404 analyzes after execution of test application software 485. For example, in one embodiment, enhanced test application sampling software 404 may reduce BBV cluster BBVC1 720, that corresponds to a program phase, to a single representative BBV. The single representative BBV corresponds to one instruction interval, such as 10 million instructions of test application software 485. One method to reduce the overall complexity, length, or size of the application software program 485 is to have the enhanced test application sampling software 404 calculate the centroid or center of each cluster and choose the BBV that is closest to the centroid or center. The dark circle or cluster data point nearest the centroid or center of cluster BBVC1 720 is the BBV that most closely fits the parameters of all of the BBVs of that cluster collectively.

Another technique that enhanced test application sampling software 404 may use to reduce each cluster in size is to choose a BBV threshold T(BBV) 780. T(BBV) 780 is a distance from the centroid of the particular BBV cluster that describes a circle encompassing a count or number of BBVs nearest the centroid of a cluster to best represent a particular cluster. For example, in one embodiment, enhanced test application sampling software 404 selects T(BBV) 780 that encompasses 3 BBVs, namely the three dark points at the center of cluster BBVC4 760. Enhanced test application sampling software 404 selected these 3 BBVs as representative BBVs. Enhanced test application sampling software 404 may employ T(BBV) 780 or a particular different T(BBV) for each BBV cluster of BBV cluster map diagram 700. Many other weighting schemes are possible as well. Designers may select weighting methodologies by determining the best trade-off between simulation time, raw data for input, number-crunching capability of the test system, and other factors.

FIG. 8 is another clustering diagram, namely an FBV cluster map diagram 800, that depicts one methodology for grouping fly-by vectors (FBVs) into clusters. FBV cluster map diagram 800 is a visual representation of one method that enhanced test application sampling software 404 employs to cluster or group instruction interval data, such as FBVs during execution and analysis of test application software 485. Each cluster data point, as seen by a small circle such as circle 810 on the FBV cluster map diagram 800, denotes one FBV of the collection of vectors that enhanced test application sampling software 404 generates during the execution and analysis of test application software 485. Stated alternatively, each cluster data point, such as circle 810 represents one instruction interval such as 10 million instructions of instruction interval 1 that enhanced test application sampling software 404 executes and analyzes.

Each BBV corresponds to one sampling instruction interval, such as 10 million instructions, of the basic block analysis of IC design model 480. For example, FBV1 515 of FIG. 5 may represent one unique cluster data point on FBV cluster map diagram 800. In this example, a cluster such as FBV cluster FBVC1 820 contains a grouping of FBVs. A cluster data point such as small circle 830 on the FBV cluster map diagram 800 denotes one FBV of an FBV cluster FBVC2 840. Cluster data point 830 denotes one FBV and corresponding instruction interval of the collection of FBVs that enhanced test application sampling software 404 generates during the execution and analysis of test application software 485. In this example, FBV cluster FBVC2 840 includes a grouping of FBVs. In this case, an FBV such as FBV2 525 is shown as one of multiple FBV cluster data points of FBV cluster FBVC2 840. In this example, a cluster, such as FBV cluster FBVC3 850 contains a grouping of FBVs.

By proper selection of the X axis and Y axis parameters, FBVs may group or cluster together in relationships that directly link to microarchitecture dependent parameters such as cache miss rates, branch mispredictions, etc. that occur during the execution of test application software 485. In this example, enhanced test application sampling software 404 generates basic block vector BBV1 510 and a respective fly-by vector FBV1 515 during execution of the same instruction interval of test application software 485. However, during clustering, enhanced test application sampling software 404 clusters or groups BBV1 510 and FBV1 515 independently. As seen in the example of FIG. 7, multiple clusters may form during the execution of test application software 485. The total number of clusters, such as FBV clusters of FBV cluster map diagram 800, may depend on the length of test application software 485, as well as other factors.

In FIG. 8 feature 1 and feature 2 respectively represent the X and Y axis parameters of the FBV cluster map diagram 800 that enhanced test application sampling software 404 may generate. The feature 1 and feature 2 parameters provide feature selection or sorting of FBVs by microarchitecture dependent characteristics. Enhanced test application sampling software 404 may use the K-Means clustering analysis method to provide an effective method of organizing the FBV cluster data points into clusters for analysis. Enhanced test application sampling software 404 analyzes FBV cluster data points by calculating the sum of the absolute difference of each of their coordinates from one another. In other words, the distance between two cluster data points is the sum of the orthogonal coordinate distance between the points.

The K-Means clustering method provides a tool for grouping or partitioning large FBV data sets into subsets or clusters such that the data in each subset share a common set of traits. K-Means clustering may provide this method for grouping the FBV results of the execution of test application software 485 by enhanced test application sampling software 404. For example, FBV cluster FBVC1 820 is a cluster that may represent a grouping of particular FBVs that have data cache miss rate information as their common trait. In this example, the common trait is instructions or basic blocks and execution counts that have data cache miss rate information in common during execution of test application software 485. A cluster FBVC2 840 may represent any other particular microarchitecture dependent grouping such as branch mispredictions during the execution of test application software 485.

The FBV cluster map diagram 800 of FBVs presents opportunities to reduce the overall benchmarking complexity by reducing the amount of data that enhanced test application sampling software 404 analyzes after execution of test application software 485. In one embodiment, enhanced test application sampling software 404 may reduce FBV cluster FBVC1 820, that corresponds to a program phase, to a single representative FBV. The single representative FBV corresponds to one instruction interval, such as 10 million instructions of test application software 485. One method to reduce the overall complexity, length, or size of the application software program is to have the enhanced test application sampling software 404 calculate the centroid or center of each cluster and choose the FBV that is closest to the centroid or center. The dark circle or cluster data point nearest the centroid or center of cluster FBVC1 820 is the FBV that most closely fits the parameters of all of the FBVs of that cluster collectively.

Another technique that enhanced test application sampling software 404 may use to reduce each cluster in size is to choose an FBV threshold T(FBV) 880. T(FBV) 880 is a distance from the centroid of an FBV cluster that describes a circle encompassing a selection of FBVs. The selection of FBVs within T(FBV) 880 best represents the particular cluster. For example, in one embodiment, enhanced test application sampling software 404 selects a T(FBV) 880 that encompasses 5 FBVs, namely the five dark points near the center of cluster FBVC3 850. Enhanced test application sampling software 404 selected these 5 FBVs as the most representative FBVs. Enhanced test application sampling software 404 may employ T(FBV) 880 or a particular different T(FBV) for each FBV cluster of FBV cluster map diagram 800. Many other weighting schemes are possible as well. Designers may select weighting methodologies by determining the best trade-off between simulation time, raw data for input, number-crunching capability of the test system, and other factors.

Enhanced test application sampling software 404 may independently reduce the BBV and FBV clusters by selecting representative instruction intervals from each BBV and FBV clusters. However, a method is disclosed for reducing the BBV and FBV clusters cooperatively. The disclosed methodology uses a process of global instruction budgeting to satisfy IC designer requirements while developing reduced and representative test application software such as representative test application software 490. IC designers assign an overall budget or total instruction count or length to representative test application software 490. In one example, designers assign a total budget of 100 million instructions to representative test application software 490. In other words, reduced and representative test application software 490 will contain a total of 100 million instructions that best matches or represents test application software 485. Reduced representative test application software 490 will execute or run faster on IC design model 480 than the original test application software 485 from which enhanced test application sampling software 404 generates the reduced representative test application software 490. This speed-up in execution time occurs because reduced representative test application software 490 is effectively smaller than the original test application software 485.

FIG. 9 is a flowchart that depicts the steps of a dual BBV and FBV clustering method that generates reduced representative test application software 490 from original test application software 485 for use in test system 400. The steps of FIG. 9 describe a methodology that strives to satisfy global or high level instruction budgets of both the BBV and FBV clusters jointly and cooperatively. The method of FIG. 9 includes test application software analysis by program tools in test application sampling software, such as enhanced test application sampling software 404. The disclosed dual BBV and FBV clustering method begins at start block 905.

Enhanced test application sampling software 404 executes BBV clustering program software that generates BBV clusters such as BBV clusters BBVC1 720, BBVC2 740, BBVC3 750, BBVC4 760 and BBVC5 770 and determines the best K(BBV), as per block 910. In one embodiment, K(BBV) is the number of BBV clusters that provide the best cluster uniformity or best selection criteria. "Best" refers to a heuristic measurement that SimPoint software using "Bayesian Information Criterion" (BIC) may provide. BIC or "Schwarz Information Criterion" (SIC) provides a statistically based methodology that determines the similarity of BBVs of each cluster in an effort to simplify the input into generation of representative test application software 490. The BIC method of enhanced test application sampling software 404 selects BBV clusters such as BBVC1 720, BBVC2 740, or other BBV clusters as shown in BBV cluster map diagram 700, that best represent test application software 485. In one example, enhanced test application sampling software may generate a K(BBV) count of five that represents the five BBV clusters of FIG. 7, namely BBVC1 720, BBVC2 740, BBVC3 750, BBVC4 760 and BBVC5 770.

Enhanced test application sampling software 404 executes FBV clustering program software that generates FBV clusters, such as FBV clusters FBVC1 820, FBVC2 840, and FBVC3 850 and determines the best K(FBV) of those FBV clusters, as per block 915. In one embodiment, K(FBV) is the number of FBV clusters that provide the best FBV cluster selection criteria. In one embodiment, SimPoint software employing BIC provides the best selection of FBV clusters for generation of representative test application software 490. BIC or SIC provides a statistical based methodology to simplify the input into generation of representative test application software 490. The BIC method of enhanced test application sampling software 404 selects FBV clusters such as FBVC1 820, FBVC2 840, or other FBV clusters as shown in FBV cluster map diagram 800 that best represent test application software 485. In one example, enhanced test application sampling software may generate a K(FBV) count of three that represents the three FBV clusters of FIG. 8, namely FBVC1 820, FBVC2 840, and FBVC3 850. Enhanced test application sampling software 404 generates microarchitecture dependent FBVs, such as those of FBV cluster map diagram 800.

Enhanced test application sampling software 404 may generate K(BBV) and K(FBV) by using a method such as the K-Means method described above. K(BBV) and K(FBV) are one measure of enhanced test application sampling software 404 that provide input into the clustering methodology to improve the representative accuracy of reduced representative test application software 490. During execution of test application software 485, enhanced test application sampling software 404 generates FBVs and then clusters the generated FBVs by counting microarchitecture dependent information that the FBVs contain. Each of these FBVs corresponds to a selected instruction interval, such as 10 million instructions of test application software 485. Instruction sampling instruction intervals of 1000 instructions, 1 million instructions, 100 million instructions and other lengths are potential alternatives. Sampling instruction interval length selection reflects the designer's desired performance resolution or detail, as well as the total allowable IC design performance modeling time available.

In one embodiment, the representative test application software 490 includes as a total length requirement, namely a total budget, of 100M instructions that IC designers or other entities select. Enhanced test application sampling software 404 determines or calculates BBV and FBV cluster budgets, namely instruction budget lengths, as per block 920. Enhanced test application sampling software 404 executes an instruction budget program and assigns each BBV cluster, such as BBV cluster BBVC1 720, a budgeting percentage in proportion to the total workload or entirety of instruction intervals of test application software 485. As shown in Table 1 below, enhanced test application sampling software 404 may assign each BBV cluster an instruction budget percentage in accordance with the total instruction budget, namely 100 million instructions in this particular example. The instruction interval is 10 million instructions in this case although other instruction intervals are acceptable as well.

TABLE 1

| BBV Cluster | Budgeting Percentage |
|---|---|
| BBVC1 | 40% |
| BBVC2 | 35% |
| BBVC3 | 10% |
| BBVC4 | 10% |
| BBVC5 | 5% |
| TOTAL | 100% |

For example, as shown in Table 1 above, BBV cluster BBVC1 720 includes a clustering of BBVs that represent 40% of the total BBVs or instruction intervals of the entire workload, such as test application software 485. BBV cluster BBVC2 740 includes a clustering of BBVs that represent 35% of the total BBV count of test application software 485. BBV cluster BBVC3 750 includes a clustering of BBVs that represent 10% of the total BBV count of test application software 485. BBV cluster BBVC4 760 includes a clustering of BBVs that represent 10% of the total BBV count of test application software 485. BBV cluster BBVC5 770 includes a clustering of BBVs that represent 5% of the total BBV count of test application software 485. The total budgeting proportional percentages sum to 100% as shown in Table 1 above.

Enhanced test application sampling software 404 executes instruction budget program software that assigns each FBV cluster, such as FBV cluster FBVC1 820, a budgeting percentage in proportion to the total workload or entirety of instruction intervals of test application software 485. As shown in Table 2 below, enhanced test application sampling software 404 may assign each FBV cluster an instruction budget percentage in accordance with the total instruction budget of 100 million instructions.

TABLE 2

| FBV Cluster | Budgeting Percentage |
|---|---|
| FBVC1 | 60% |
| FBVC2 | 25% |
| FBVC3 | 15% |
| TOTAL | 100% |

As shown in Table 2 above, FBV cluster FBVC1 820 includes a clustering of FBVs that represent 60% of the total BBVs or instruction intervals of the entire workload, such as test application software 485. FBV cluster FBVC2 840 includes a clustering of FBVs that represent 25% of the total FBV count of test application software 485. FBV cluster FBVC3 850 includes a clustering of FBVs that represents 15% of the total FBV count of test application software 485. The total FBV budgeting proportional percentages sum to 100% as shown in Table 2 above. As part of the budgeting program software, enhanced test application sampling software 404 may multiply the total instruction budget goal of 100M instruction times each BBV budgeting percentage in Table 1 above to generate BBV cluster instruction budgets as seen in Table 3 below.

TABLE 3

| BBV Cluster | Instruction Budget |
| --- | --- |
| BBVC1 | 40 million |
| BBVC2 | 35 million |
| BBVC3 | 10 million |
| BBVC4 | 10 million |
| BBVC5 | 5 million |
| TOTAL | 100 million |

For example, as shown in Table 3 above, BBV cluster BBVC1 720 includes an instruction budget of 40 million instructions. In other words, BBVC1 720 includes a goal or clustering budget of 40 million instructions of representative test application software 490 that totals 100 million instructions. BBV cluster BBVC2 740 includes a clustering budget of 35 million instructions of representative test application software 490. BBV cluster BBVC3 750 includes a clustering budget of 10 million instructions of the 100 million instructions of representative test application software 490. BBV cluster BBVC4 760 includes a clustering budget of 10 million instructions of representative test application software 490.

The final BBV cluster in the clusters of BBV cluster map diagram, namely BBV cluster BBVC5 770, includes a clustering budget of 5 million instructions of the 100 million instructions of representative test application software 490. The total instruction budget sums to 100 million instructions as shown in Table 3 above. As part of the budgeting program software, enhanced test application sampling software 404 may multiply the total instruction budget goal of 100M instruction times each FBV budgeting percentage in Table 2 above to generate FBV cluster instruction budgets as seen in Table 4 below.

TABLE 4

| FBV Cluster | Instruction Budget |
| --- | --- |
| FBVC1 | 60 million |
| FBVC2 | 25 million |
| FBVC3 | 15 million |
| TOTAL | 100 million |

As shown in Table 4 above, FBV cluster FBVC1 820 includes an instruction budget of 60 million instructions. In other words, FBVC1 820 includes a goal or clustering budget of 60 million instructions of representative test application software 490 that totals 100 million instructions. FBV cluster FBVC2 840 includes a clustering budget of 25 million instructions of representative test application software 490. Finally, FBV cluster FBVC3 850 includes a clustering budget of 15 million instructions of the 100 million instructions of representative test application software 490. The total instruction budget sums to 100 million instructions as shown in Table 4 above.

After the instruction budgeting analysis, each BBV cluster of K(BBV) clusters and each FBV cluster of K(FBV) clusters of test application software 485 corresponds to a respective instruction budget proportion of the total 100 million instruction budget or goal for representative test application software 490. Each FBV in an FBV cluster corresponds to a respective BBV in a particular BBV cluster wherein the FBV and respective BBV share the same instruction interval in common.

In other words, each instruction interval in a particular FBV cluster belongs to or is a member of some BBV cluster.

In one embodiment, enhanced test application sampling software 404 places a priority on the BBV clusters because BBV clusters are known to predominantly reflect test application software program phases. However, another aspect of one embodiment of the disclosed methodology is to include FBV cluster information that incorporates the effects of microarchitecture dependent information. In other words, satisfying both the BBV cluster instruction budgets as well as the FBV cluster instruction budgets produces a much improved grouping of instruction intervals for generation of representative test application software 490. The disclosed dual BBV and FBV clustering methodology of FIG. 9 strives to find instruction intervals, namely BBVs close to the BBV cluster centroid, that fulfill the BBV instruction budgets while also fulfilling the FBV instruction budgets.

One method to ensure the priority of BBV clustering over FBV clustering is to select instruction intervals closest to the centroid of the BBV clusters, such as those of FIG. 7. The closer the instruction interval is to the centroid of the particular BBV cluster, the greater that instruction interval represents or reflects the entire instruction set of that particular BBV cluster. Enhanced test application sampling software 404 selects instruction intervals of BBV clusters, such as those of FIG. 7, and identifies instruction interval sample sets or sample set records. The instruction interval sample sets are collections of instruction intervals that satisfy BBV cluster instruction budgets but having no instruction interval further than the BBV threshold T(BBV) 780 from any BBV cluster centroid. Enhanced test application sample software 404 identifies instruction interval sample sets or sample set records, as per block 930. Enhanced test application sampling software 404 maintains "BBV budgets satisfied sample set" records that satisfy the above requirements for later use in the disclosed methodology.

Enhanced test application sampling software 404 identifies all sample sets from the "BBV budgets satisfied sample set" records wherein all FBV cluster instruction budgets are met, and generates "FBV budgets satisfied sample set" records from those results, as per block 935. In the selection process of the "BBV budgets satisfied sample set", enhanced test application sampling software 404 uses T(BBV) 780 to determine eligible BBVs in each BBV cluster for inclusion in the "BBV budgets satisfied sample set" records. Enhanced test application sampling software 404 may use other methods to determine the best representative BBVs to include for consideration in the generation of representative test application software 490. Such methods include a common T(BBV) for all clusters, individual T(BBV)s for each cluster, or other ranking and weighting methodologies. In one embodiment, enhanced test application sampling software 404 determines any BBV outside of T(BBV) 780 as ineligible for inclusion in the "BBV budgets satisfied sample set".

Unfortunately, T(BBV) 780 may be a selection by user, software, or other entity, that may not provide a sufficient number of instruction intervals for consideration in generating a minimum of one record or member of the "FBV budgets satisfied sample set". Enhanced test application sampling software 404 performs a test to determine if one or more "FBV budgets satisfied set" records exist, as per decision block 940. If one or more "FBV budgets satisfied samples set" records do not exist, then enhanced test application sampling software 404 selects the "BBV budgets satisfied sample set" records with the lowest FBV proportion distortion, as per block 950. The lowest FBV proportion distortion is the "BBV budgets satisfied sample set" record that demonstrates the best representation to the FBV cluster instruction budget requirements, such as those of Table 4 above. Proportion distortion is the difference between the ideal proportion or FBV cluster instruction budget requirement, such as those of Table 4 above, and the FBV cluster instruction budget that enhanced test application sample software 404 generates.

Enhanced test application sampling software 404 selects the "BBV budgets satisfied sample set" record with the lowest FBV proportion distortion and the highest goodness score, as per block 960. The goodness score is a measure of how representative the instruction intervals in the "BBV budgets satisfied sample set" are to their BBV and FBV cluster centroids, respectively. In other words, the goodness score is a weighted average of the distance from the BBV and FBV cluster centroid to the respective BBV or FBV corresponding to each instruction interval in the "BBV budgets satisfied sample set". The higher the goodness score, the more representative a particular instruction interval and respective BBV are for inclusion in the instruction intervals of representative test application software 490. The IC designer may preset the T(BBV) threshold prior to execution of enhanced test application sampling software 404.

The BBV threshold, such as T(BBV) 780 is one of multiple parameters that IC designers can preset to modify the operating constraints of enhanced test application sampling software 404. Other parameters, such as the total representative test application software 490 instruction budget, allow IC designers flexibility in managing trade-offs between CPI error reduction, total operating time, and other characteristics of the IC design benchmarking process. Distance from the BBV cluster's centroid to the respective BBV corresponding to each instruction interval is a dominant factor in the decision to include or not include that instruction interval in the "BBV budgets satisfied sample set". In one embodiment, this distance factor is more important than the distance of the instruction interval from the corresponding FBV cluster centroid. However, by including proportion distortion and goodness score results in the instruction interval selection process, instruction interval selection includes the weight of the FBV cluster and thus microarchitecture dependent data effects.

If one or more members or records of the "FBV budgets satisfied sample set" exist at decision block 940, then enhanced test application sampling software 404 does not include the lowest proportion distortion selection of blocks 950 and 960. However, if one or more records in the "FBV budgets satisfied sample set" do not exist at decision block 940, then enhanced test application sampling software 404 includes the lowest proportion distortion selection of blocks 950 and 960. Enhanced test application sampling software 404 selects the "FBV budgets satisfied sample set" with the highest goodness score, as per block 970. Enhanced test application sampling software 404 generates reduced representative test application software 490 from the "FBV budgets satisfied sample set" with the highest goodness score, as per block 980.

The dual BBV and FBV clustering method ends at end block 990. The reduced representative test application software 490 that this method produces is representative of the larger test application software 485' even though representative test application software 490 includes substantially fewer instructions than the larger test application software 485' from which it derives. Reduced representative test application software 490 effectively provides a reduced workload in comparison with the length of the original workload or test application software 485'. In other words, when enhanced test application sampling software 404 executes the reduced representative test application software 490, the IC design model 480 responds in close approximation to that of the original test application software or workload 485'. The more closely the representative test application software 490 approximates execution of test application software 485' on IC design model 480, the more efficient and effective the benchmarking process becomes.

The foregoing discloses methodologies wherein an IC design test system employs enhanced test application sampling software to provide IC design personnel with IC design system tools for simulation, design benchmarking, and other analysis. In one embodiment, enhanced test application sampling software initiates multiple programs such as instruction trace, simulation point sampling, basic block vector generation, fly-by vector generation, K-Means clustering analysis, and BBV and FBV instruction budgeting. Designers may use the enhanced test application sampling software tools to perform IC design model performance and benchmarking analysis.

Modifications and alternative embodiments of this invention will be apparent to those skilled in the art in view of this description of the invention. Accordingly, this description teaches those skilled in the art the manner of carrying out the invention and is intended to be construed as illustrative only. The forms of the invention shown and described constitute the present embodiments. Persons skilled in the art may make various changes in the shape, size and arrangement of parts. For example, persons skilled in the art may substitute equivalent elements for the elements illustrated and described here. Moreover, persons skilled in the art after having the benefit of this description of the invention may use certain features of the invention independently of the use of other features, without departing from the scope of the invention.

What is claimed is:

1. A method of integrated circuit (IC) design model testing, comprising:

providing an original workload program to a simulator test system, the original workload program exhibiting a first executable instruction length, the simulator test system including an IC design model and workload reduction software (WRS);

apportioning, by the WRS of the simulator test system, the original workload program into a plurality of instruction intervals;

generating, by the WRS of the simulator test system, a respective basic block vector (BBV) per instruction interval, the resultant BBVs including basic block execution count information;

generating, by the WRS of the simulator test system, a respective fly-by vector (FBV) per instruction interval independent of the BBV for that same instruction interval, the resultant FBVs including microarchitecture dependent information;

clustering, by the WRS of the simulator test system, the resultant BBVs into a plurality of BBV clusters, each BBV cluster representing a program phase of the original workload program;

clustering, by the WRS of the simulator test system, the resultant FBVs into a plurality of FBV clusters, each FBV cluster representing a program phase of the original workload program, the clustering of FBVs being independent of the clustering of the BBVs;

generating, by the WRS of the simulator test system, a reduced workload program representative of the original workload program, by using microarchitecture dependent information related to the BBV clusters and FBV clusters, the reduced workload program exhibiting a second executable instruction length less than the first executable instruction length; and executing the reduced workload program on the IC design model of the simulator test system.

2. The method of claim 1, further comprising generating a BBV cluster budget for the BBV clusters.

3. The method of claim 2, further comprising generating an FBV cluster budget for the FBV clusters.

4. The method of claim 3, wherein the third generating step includes selecting respective thresholds for the BBV clusters, the thresholds being selected to choose representative instruction intervals that form the reduced workload program.

5. The method of claim 4, wherein a threshold is selected for a particular BBV cluster such that a chosen representative instruction internal is no further away than the threshold from a respective BBV centroid of the particular BBV cluster.

6. The method of claim 4, wherein the chosen representative instruction intervals satisfy both the BBV instruction budget and the FBV instruction budget.

7. An integrated circuit (IC) design model simulator test system comprising:
a processor;
a memory store, coupled to the processor, the memory store including an IC design model and an original workload program exhibiting a first executable instruction length, the memory store being configured to:
apportion the original workload program into a plurality of instruction intervals;
generate a respective basic block vector (BBV) per instruction interval, the resultant BBVs including basic block execution count information;
generate a respective fly-by vector (FBV) per instruction interval independent of the BBV for that same instruction interval, the resultant FBVs including microarchitecture dependent information;
cluster the resultant BBVs into a plurality of BBV clusters, each BBV cluster representing a program phase of the original workload program;
cluster the resultant FBVs into a plurality of FBV clusters, each FBV cluster representing a program phase of the original workload program, the clustering of FBVs being independent of the clustering of the BBVs; and
generate a reduced workload program representative of the original workload program, by using microarchitecture dependent information related to the BBV clusters and FBV clusters, the reduced workload program exhibiting a second executable instruction length less than the first executable instruction length; and
executing the reduced workload program on the IC design model of the simulator test system.

8. The IC design model simulator test system of claim 7, wherein the memory store is further configured to generate a BBV cluster budget for the BBV clusters.

9. The IC design model simulator test system of claim 8, wherein the memory store is further configured to generate an FBV cluster budget for the FBV clusters.

10. The IC design model simulator test system of claim 9, wherein the memory store is further configured to select respective thresholds for the BBV clusters, the thresholds being selected to choose representative instruction intervals that form the reduced workload program.

11. The IC design model simulator test system of claim 10, wherein the memory store is further configured to select a threshold for a particular BBV cluster such that a chosen representative instruction internal is no further away than the threshold from a respective BBV centroid of the particular BBV cluster.

12. The IC design model simulator test system of claim 10, wherein the chosen representative instruction intervals satisfy both the BBV instruction budget and the FBV instruction budget.

13. A computer program product stored on a non-transitory computer operable medium, comprising:
instructions that apportion an original workload program into a plurality of instruction intervals, the original workload program exhibiting a first executable instruction length, the original workload program being adapted for use in a simulator test system that includes an IC design model;
instructions that generate a respective basic block vector (BBV) per instruction interval, the resultant BBVs including basic block execution count information;
instructions that generate a respective fly-by vector (FBV) per instruction interval independent of the BBV for that same instruction interval, the resultant FBVs including microarchitecture dependent information;
instructions that cluster the resultant BBVs into a plurality of BBV clusters, each BBV cluster representing a program phase of the original workload program;
instructions that cluster the resultant FBVs into a plurality of FBV clusters, each FBV cluster representing a program phase of the original workload program, the clustering of FBVs being independent of the clustering of the BBVs;
instructions that generate a reduced workload program representative of the original workload program, by using microarchitecture dependent information related to the BBV clusters and FBV clusters, the reduced workload program exhibiting a second executable instruction length less than the first executable instruction length; and
instructions that execute the reduced workload program on the IC design model of the simulator test system.

14. The computer program product of claim 13, further comprising instructions that generate a BBV cluster budget for the BBV clusters.

15. The computer program product of claim 14, further comprising instructions that generate an FBV cluster budget for the FBV clusters.

16. The computer program product of claim 15, further comprising instructions that select respective thresholds for the BBV clusters, the thresholds being selected to choose representative instruction intervals that form the reduced workload program.

17. The computer program product of claim 16, further comprising instructions that select a threshold for a particular BBV cluster such that a chosen representative instruction internal is no further away than the threshold from a respective BBV centroid of the particular BBV cluster.

18. The computer program product of claim 16, wherein the chosen representative instruction intervals satisfy both the BBV instruction budget and the FBV instruction budget.

* * * * *